(12) United States Patent
Watanabe et al.

(10) Patent No.: US 7,508,234 B2
(45) Date of Patent: Mar. 24, 2009

(54) OPTICALLY RECONFIGURABLE GATE ARRAY WRITE STATE INSPECTION METHOD, WRITE STATE INSPECTION DEVICE, AND OPTICALLY RECONFIGURABLE GATE ARRAY

(75) Inventors: Minoru Watanabe, Iizuka (JP); Fuminori Kobayashi, Munakata (JP)

(73) Assignees: Japan Science and Technology Institute (JP); Kyushu Institute of Technology (JP)

( * ) Notice: Subject to any disclaimer, the term of this patent is extended or adjusted under 35 U.S.C. 154(b) by 0 days.

(21) Appl. No.: 11/629,750

(22) PCT Filed: Jun. 16, 2005

(86) PCT No.: PCT/JP2005/011026

§ 371 (c)(1),
(2), (4) Date: Jun. 4, 2007

(87) PCT Pub. No.: WO2005/125013

PCT Pub. Date: Dec. 29, 2005

(65) Prior Publication Data

US 2008/0030225 A1 Feb. 7, 2008

(30) Foreign Application Priority Data

Jun. 18, 2004 (JP) .............................. 2004-181913

(51) Int. Cl.
*H01L 25/00* (2006.01)
*H03K 19/177* (2006.01)
*H03K 17/693* (2006.01)

(52) U.S. Cl. .......................................... 326/41; 716/16

(58) Field of Classification Search ............. 326/37–41, 326/47; 716/16
See application file for complete search history.

(56) References Cited

U.S. PATENT DOCUMENTS 5,959,747 A 9/1999 Psaltis et al.

(Continued)

FOREIGN PATENT DOCUMENTS

JP 7-99439 4/1995

(Continued)

OTHER PUBLICATIONS

Watanabe, Minoru; Kobayashi, Fuminori, An Improved Dynamic Optically Reconfigurable Gate Array, 2005☐☐IEEE Computer Society Annual Symposium, 7-0695-2365-X/05, pp. 1-6.*

(Continued)

*Primary Examiner*—Rexford Barnie
*Assistant Examiner*—Dylan White
(74) *Attorney, Agent, or Firm*—Edwards, Angell, Palmer & Dodge, LLP

(57) ABSTRACT

A technology for inspecting a write state without requiring a dedicated circuit for write state inspection of a local circuit in an ORGA. Upon switching an optical signal to be irradiated on an optically reconfigurable bit element as an inspection target from ON to OFF, in the logical circuit structure of the ORGA, first and second optical signal patterns having the optical signal ON/OFF to be irradiated to the optically reconfigurable bit element serving as optical signal patterns configuring the logical structure in which at least one logical level or output impedance changes are sequentially irradiated and input to the logical circuit. In addition, an output-state detection circuit that is connected to the logical output terminals and detects whether the logical level of the output terminal is at an H level, L level, or high impedance detects the output state.

13 Claims, 14 Drawing Sheets

U.S. PATENT DOCUMENTS

| | | | | |
|---|---|---|---|---|
| 6,057,703 | A | * | 5/2000 | Mok et al. ..................... 326/38 |
| 6,072,608 | A | | 6/2000 | Psaltis et al. |
| 6,583,645 | B1 | * | 6/2003 | Bennett et al. ................ 326/41 |

FOREIGN PATENT DOCUMENTS

JP          2002-353317         12/2002

OTHER PUBLICATIONS

Watanabe, Minoru; Kobayashi, Fuminori, An Optically Differential Reconfigurable Gate Array with a Holographic Memory, 2006☐☐IEEE, 1-4244-0054-6/06.*

Watanabe, Minoru; Kobayashi, Fuminori, An Improved Dynamic Optically Reconfigurable Gate Array, 2005DDIEEE Computer Society Annual Symposium, 7-0695-2365-X/05, pp. 1-6.*

Watanabe, Minoru; Kobayashi, Fuminori, An Optically Differential Reconfigurable Gate Array with a Holographic Memory, 2006DDIEEE, 1-4244-0054-6/06.*

Mumbru, Jose; Panotopoulos, George; Psaltis, Demetri, Optically Programmable Gate Array, Optics in Computing 2000, SPIE vol. 4089 (2000) 0277-786X/00.*

J. Mumbru, et al.; "Optically Programmable Gate Array;" *Optics in Computing 2000*; SPIE vol. 4089; 2000; pp. 763-771.

J. Mumbru, et al.; "Optical memory for computing and information processing;" *Part of the SPIE Conference on Algorithms, Devices, and Systems for Optical Information Processing III*; SPIE vol. 3804; Jul. 1999; pp. 14-24.

J. Mumbru, et al.; "Optically Reconfigurable Gate Array;" *Proceedings of the $29^{th}$ Applied Imagery Pattern Recognition Workshop (AIPR '00)*; 2000; 1 Sheet.

J. Mumbru, et al.; "Optically Programmable FPGA Systems;" *California Institute of Technology Division of Engineering and Applied Science*; http://www.cnse.caltech.edu/Research02/reports/panotopoulos2full.htlm; 11 Sheets in color.

M. Watanabe, et al.; "Design of an Optically Differential Reconfigurable Gate Array VLSI chip with optically and electrically controlled logic blocks;" *SOC Conference, Proceedings, IEEE International*; 2003; pp. 287-288.

* cited by examiner

OPTICALLY RECONFIGURABLE GATE ARRAY WRITE STATE INSPECTION METHOD, WRITE STATE INSPECTION DEVICE, AND OPTICALLY RECONFIGURABLE GATE ARRAY

BACKGROUND OF THE INVENTION

1. Field of the Invention

The present invention relates to an inspection technology of an information write state upon writing information on the structure of a logical circuit with an optical signal on an optically reconfigurable gate array.

2. Description of the Related Art

Recently, as a logical device that can reconfigure a circuit logical structure in accordance with purposes by electrically inputting a logical structure, a field programmable gate array (Field Programmable Gate Array: hereinafter, referred to as an "FPGA") is widely used. However, the FPGA uses the structure for connecting a memory that stores information on the circuit structure and a reconfigurable gate array VLSI with a metallic wiring, and the FPGA therefore has a limitation for reducing a reconfiguring time of the circuit logical structure.

Then, recently, as a technology for dramatically reducing the reconfiguring time of the circuit logical structure, an optically reconfigurable gate array (Optically Reconfigurable Gate Array: ORGA) is searched and developed (refer to, e.g., Patent Documents 1 to 4 and Non-Patent Documents 1 to 4). The optically reconfigurable gate array is a device comprising two parts of an optical unit that outputs information on the circuit logical structure as an optical signal pattern and a VLSI unit that configures the circuit logical structure in accordance with the optical signal pattern, and executes the reconfiguration of the logical structure of the VLSI unit with the optical signal pattern from the optical unit in parallel. In general, as an optical memory that stores information on the structure of the logical circuit in the optical unit, a commutative medium is used to freely change the information on the circuit structure.

In the optically reconfigurable gate arrays, optically reconfigurable bit elements are provided at circuit positions in a chip (logical circuit chip) having a logical-circuit serving as the VLSI unit, and an optical signal pattern including the information on the configuration of the logical circuit is electrically converted into an electrical signal. The input information on the structure of the logical circuit is stored in the circuit. Further, the circuit connection is switched in accordance with the information on the configuration of the logical circuit, thereby reconfiguring the logical circuit.

As mentioned above, in the optically reconfigurable gate array, the optical unit and the VLSI unit (logical circuit chip) are arranged as independent parts. Therefore, various factors including the positional displacement of light emission and out-of-focusing cause a write error upon writing the information on the configuration of the logical circuit to the VLSI unit. The write error causes abnormal operation of the VLSI unit. Thus, it is inevitable for the optically reconfigurable gate array to inspect in advance the information write state of the VLSI unit.

Then, a dedicated circuit for inspecting the write state of the optically reconfigurable bit element (hereinafter, referred to as a "write state inspection circuit") is integrated to the logical circuit of the VLSI unit in the conventional optically reconfigurable gate array. In general, the write state inspection circuit comprises one to three reading transistors that read the logical level of the written signal corresponding to the optically reconfigurable bit element, a wiring that externally pulls-out the logical level read by the reading transistors, and a decoder circuit that selects the optically reconfigurable bit element for executing the inspection.

Upon executing the inspection of the write state, the decoder circuit first selects the optically reconfigurable bit element as an inspection target. Further, the reading transistor reads the logical level of one-bit information on the circuit structure written by the optically reconfigurable bit element and compares the read logical level with a normal write value, thereby inspecting whether or not the logical level is normally written. This procedure is iterated for all the optically reconfigurable bit elements. If the write states of all the optically reconfigurable bit elements are normal, the inspection ends. This inspection is executed once after first setting the optical memory of the optical unit. After normally setting a physical positional relationship between the optical memory and the logical circuit chip, the write state inspection circuit is not required.

[Patent Document 1]
Japanese Unexamined Patent Application Publication No. 2002-353317
[Patent Document 2]
U.S. Pat. No. 5,959,747
[Patent Document 3]
U.S. Pat. No. 6,057,703
[Patent Document 4]
U.S. Pat. No. 6,072,608
[Non-Patent Document 1]
J. Mumbru, G. Panotopoulos, D. Psaltis, X. An, F. Mok, S. Ay, S. Barna, and E. Fossum, "Optically Programmable Gate Array", Proc. SPIE of Optics in Computing 2000, The International Society for Optical Engineering, May 2000, Vol. 4089, pp. 763-771
[Non-Patent Document 2]
J. Mumbru, G. Zhou, X. An, W. Liu, G. Panotopoulos, F. Mok, and S. Psalt is, "Optical memory for computing and information processing", Proc. SPIE on Algorithms, Devices, and Systems for Optical Information Processing III, The International Society for Optical Engineering, July 1999, Vol. 3804, pp. 14-24
[Non-Patent Document 3]
J. Mumbru, G. Panotopoulos, D. Psaltis, X. An, G. Zhou, F. Mok, "Optically Reconfigurable Gate Array", Proceedings of the 29th Applied Imagery Pattern Recognition Workshop (AIPR '00), IEEE Computer Society, Oct. 16-18, 2000, pp. 84
[Non-Patent Document 4]
Jose Mumbru, George Panotopoulos, Arrigo Benedetti, Demetri Psaltis, Pietro Perona, "Optically Programmable FPGA Systems", [online], on Dec. 13, 2001, California Institute of Technology Division of Engineering and Applied Science, [searched on Jul. 21, 2003,], Internet <URL: http://www.cnse.caltech.edu/Research02/reports/panotopoulos2 full.html>

SUMMARY OF THE INVENTION

As mentioned above, the write state inspection circuit is used only for first positioning of the optical memory in the optical unit. Further, when a desired logical circuit actually configures the VLSI unit and is executed, the write state inspection circuit is not required. Therefore, preferably, the mounting region of the write state inspection circuit is smaller as much as possible and the mounting area of the gate array in the VLSI unit is larger.

However, the write state inspection circuit needs two to three reading transistors and a reading wiring corresponding to the optically reconfigurable bit elements as mentioned above. Further, the write state inspection circuit needs a decoder circuit that switches the optically reconfigurable bit elements as the inspection target. Therefore, the mounting region of the write state inspection circuit occupies 10 to 25% of the entire mounting area of the VLSI unit.

As mentioned above, the write state inspection circuit integrated in the logical circuit of the VLSI unit suppresses the mounting area of the gate array in the logical circuit and becomes a drawback in view of improvement in gate density of the logical circuit.

Then, it is an object of the present invention to provide a write state inspection technology that does not require a dedicated circuit for inspecting a write state of a logical circuit of an optically reconfigurable gate array.

Means for Solving the Problems

As a first structure of a write inspection method of an optically reconfigurable circuit of the present invention, the optically reconfigurable gate array has a logical circuit having a plurality of optically reconfigurable bit elements and enables the reconfiguration of the logical structure of the logical circuit by reading a desired optical signal pattern stored in an optical memory and irradiating a logical circuit chip with an optical signal. The write state inspection method for inspecting an information write state of the optically reconfigurable bit element with the optical signal, comprises: a first step of configuring, to the logical circuit, a logical structure (hereinafter, a "logical circuit for inspection") for inspecting the optically reconfigurable bit element by irradiating an optical signal pattern for inspection (hereinafter, referred to as an "inspection pattern") stored in advance to the optical memory to the logical circuit chip; a second step of detecting whether an output state of an output terminal of the logical circuit chip to the logical circuit for inspection is a state of the logical level as the H level, the logical level as the L level, or the output impedance as high impedance; and a third step of judging, by comparing the detected state with the normal output state of the logical circuit for inspection, whether the information write state of the optically reconfigurable bit element with the optical signal is successful or unsuccessful. In the write state inspection method, the inspection pattern includes a first inspection pattern in which the optical signal irradiated to the optically reconfigurable bit element as an inspection target is in an OFF-state and a second inspection pattern in which the optical signal irradiated to the optically reconfigurable bit element as the inspection target is in an ON-state, and the first step to third step are executed by sequentially irradiating the first and second inspection patterns in order of the two inspection patterns or inverse order.

With this structure, the logical circuit for inspection is formed in the logical circuit that can be reconfigured in the logical circuit chip, and the logical circuit itself including the optically reconfigurable bit element as an inspection target is used. Thus, the inspection of the information write state using the optical signals of the optically reconfigurable bit elements can be executed. Therefore, the integration of the dedicated circuit for inspection into the logical circuit chip is not required.

In this case, since the inspection pattern used for inspection of the write state of the optically reconfigurable bit element needs to be partly stored in the optical memory, the storage capacity of the optical memory is consumed. However, the storage capacity of the optical memory is normally extremely large. Therefore, even if the inspection pattern is stored by partly consuming the optical pattern, the optical memory can sufficiently store another information on the reconfiguration of the logical circuit other than the inspection pattern. Therefore, the optical signal pattern used for inspection of the write state is partly stored to the optical memory. Thus, as compared with such a demerit that the storage capacity of the optical memory is consumed, such a merit that the mounting area of the inspection circuit of the write state in the chip of the optically reconfigurable gate array is greatly reduced is extremely large.

Further, upon switching the first inspection-pattern and the second inspection-pattern, if the change of the output state from the output terminal of the logical circuit matches the normal output state that is obtained in advance, it is determined that the optical signal is normally written to the optically reconfigurable bit element as the inspection target. On the contrary, if the change of the output state from the output terminal of the logical circuit does not match the normal output state that is obtained in advance, it is determined that the optical signal is not normally written to the optically reconfigurable bit element as the inspection target.

Therefore, the inspection of the information write state can be executed with the optical signals of the optically reconfigurable bit elements by using the logical circuit including the optically reconfigurable bit element as the inspection target without integrating the dedicated circuit for inspection in the logical circuit chip.

Herein, as an optical memory, e.g., a hologram memory, a film, a CD, an MD, a DVD, and another spatial optical modulation device are used.

Incidentally, in the specification, the "optically reconfigurable bit element" is an element that converts an optical signal into an electrical signal upon receiving the optical signal and holds the converted signal as one-bit logical information.

As a second structure of the write state inspection method according to the present invention, with the first structure, the logical circuit for inspection has a logical structure in which the output of the output terminal of the logical circuit chip changes depending on an input of the optical signal to the optically reconfigurable bit element as the inspection target.

With this structure, the logical circuit for inspection can detect a case in which the information write state of the optically reconfigurable bit element as the inspection target is not normal by detecting the output state of the output terminal of the logical circuit chip because the output from the output terminal of the logical circuit chip changes depending on the input of the optical signal to the optically reconfigurable bit element as the inspection target.

As a third structure of the write state inspection method according to the present invention, with the first structure, the logical circuit for inspection has a logical structure in which the output of the output terminal of the logical circuit chip changes depending on the input of the optical signal to the optically reconfigurable bit element and does not depend on the input of the optical signal to the optically reconfigurable bit element whose inspection of the write state does not end yet.

With this structure, since the output from the output terminal of the logical circuit chip does not change depending on the input of the optical signal to the optically reconfigurable bit element whose inspection of the information write state does not end yet. In the logical circuit for inspection, the possibility that the write state of another optically reconfigurable bit element other than the optically reconfigurable bit element as the inspection target is abnormal is excluded. Therefore, it is possible to precisely execute the inspection of the information write state of the optically reconfigurable bit element as the inspection target.

As a first structure of a write state inspection device of an optically reconfigurable gate array according to the present invention, the optically reconfigurable gate array includes a logical circuit chip has a logical circuit having a plurality of optically reconfigurable bit elements and enables the reconfiguration of the logical structure of the logical circuit by reading a desired optical signal pattern stored in an optical memory and irradiating a logical circuit chip with an optical signal. The write state inspection device for inspecting an information write state of the optically reconfigurable bit element with the optical signal, comprises: the optical memory that stores an optical signal pattern for inspection (hereinafter, "inspection pattern") for configuring a logical structure (hereinafter, "logical circuit for inspection") for inspecting the optically reconfigurable bit element to the logical circuit; inspection-signal input means that reads the inspection pattern stored in the optical memory as an optical signal pattern and irradiates the logical circuit chip; and output-state detection means that detects whether the output state of an output terminal of the logical circuit chip is the logical level as the H level, logical level as the L level, or output impedance as high impedance. In the write state inspection device, the optical memory stores a first inspection pattern in which the optical signal irradiated to the optically reconfigurable bit element as an inspection target is in the OFF-state and a second inspection pattern in which the optical signal irradiated to the optically reconfigurable bit element as the inspection target is in the ON-state, the inspection-signal input means sequentially irradiates the first and second inspection patterns in order of the two inspection patterns or inverse order, and the output-state detection means detects, for the inspection patterns, whether the output state of the output terminal of the logical circuit chip is the logical level as the H level, logical level as the L level, or output impedance as high impedance.

With this structure, the inspection-signal input means sequentially irradiates and inputs the first inspection pattern and second inspection pattern to logical circuit in the order or inverse order. The output state detection circuit detects the output state of the output terminal of the logical signal upon inputting the optical signal pattern. If detecting the output states, the output states are compared with the normal output state that is obtained in advance, thereby inspecting whether or not the write state of the optically reconfigurable bit element is normal.

Further, the inspection-signal input means irradiates the inspection pattern stored in the optical memory to the logical circuit chip, thereby configuring the logical circuit for inspection in the logical circuit chip. The logical circuit for inspection outputs data in accordance with the information write state of the optically reconfigurable bit element as the inspection target to the output terminal of the logical circuit chip. Therefore, the output-state detection means detects the output state of the logical circuit chip, thereby detecting whether or not the information write state of the optically reconfigurable bit element is normal. In this case, the logical circuit for inspection uses a reconfigurable logical circuit in the logical circuit chip and the logical circuit chip therefore does not need to include the dedicated circuit. Thus, it is possible to remove a drawback when the logical circuit necessary for inspection improves the gate density of the logical circuit in the logical circuit chip.

As mentioned above, since the storage capacity of the optical memory is extremely large, there are not any problems in practical use due to the consumption of the storage capacity of the optical memory.

Incidentally, the write state inspection device according to the present invention may be mounted as another chip or substrate of the optically reconfigurable gate array and, alternatively, may be mounted on the same chip of the optically reconfigurable gate array.

Since the number of the output terminals of the package is limited, the number of output terminals of the logical circuit is generally extremely smaller, as compared with the number of gates of the logical circuit. Therefore, even if a circuit as the output-state detection means is mounted on the chip of the optically reconfigurable gate array, the mounting area occupied by the circuit is extremely smaller, as compared with the area of the gate array region or wiring region. Thus, there are not any problems upon improving the gate density of the logical circuit in the logical circuit chip.

As a second structure of the write state inspection device of the optically reconfigurable gate array according to the present invention, with the first structure, the write state inspection device further comprises: output-state judgment means that judges, by comparing the output state of the output terminal of the logical circuit chip of the logical circuit for inspection detected by the output state detection circuit with a normal output state of the logical circuit for inspection, whether the information write state of the optically reconfigurable bit element with the optical signal is successful or unsuccessful.

With this structure, it is possible to automatically determine, with the output-state judgment means, whether or not the information write state of the optically reconfigurable bit element as the inspection target is normal.

As a third structure of the write state inspection device of the optically reconfigurable gate array according to the present invention, with the first or second structure, the logical circuit for inspection has a logical structure in which the output of the output terminal of the logical circuit chip changes depending on the input of the optical signal to the optically reconfigurable bit element as an inspection target.

With this structure, the output from the output terminal of the logical circuit chip changes depending on the input of the optical signal to the optically reconfigurable bit element as the inspection target, the logical circuit for inspection can detect that the information write state of the optically reconfigurable bit element as the inspection target is not normal by detecting the output state of the output terminal of the logical circuit chip.

As a fourth structure of the write state inspection device of the optically reconfigurable gate array according to the present invention, with any one of the first to third structures, the output-state detection means comprises: a voltage detection circuit that detects a voltage of the output terminal of the logical circuit; and a detection voltage applying circuit that switchably applies a voltage not less than a logical threshold or voltage not more than the logical threshold to the output terminal of the logical circuit via a resistor.

With this structure, the detection voltage applying circuit applies the voltage not less than the logical threshold and the voltage not more than the logical threshold to the output terminal of logical circuit via the resistor and the voltage detection circuit detects the voltage of the output terminal upon applying the voltage, thereby detecting the output state of the output terminal. That is, when the output state of the output terminal is at the H level or L level, even if the voltage applied by the detection voltage applying circuit is changed, the voltage of the output terminal does not change from the H level or L level. On the other hand, when the output state of the output terminal is at the high impedance and the voltage applied by the detection voltage applying circuit is not less than the logical threshold, the voltage of the output terminal is at the H level and, when it is not more than the logical threshold, the voltage of the output terminal is at the L level. Therefore, this enables the detection as the output state of the output terminal is any of the L-level state, H-level state, or high-impedance state.

As a first structure of an optically reconfigurable gate array according to the present invention, the optically reconfigurable gate array includes a logical circuit chip having a logical circuit having a plurality of optically reconfigurable bit elements and enables the reconfiguration of a logical structure of the logical circuit by reading a desired optical signal pattern stored in an optical memory and irradiating the logical circuit chip with an optical signal. The optically reconfigurable gate array comprises: an output-state detection circuit that is connected to an output terminal of the logical circuit chip and detects the logical level of the output terminal as the H level state, the logical level of the output terminal as the L level state, or the output impedance of the output terminal as the high impedance state. In the optically reconfigurable gate array, the logical circuit mounted on the logical circuit chip comprises: an optically reconfigurable logical block having an optically reconfigurable logical circuit having a plurality of optically reconfigurable bit elements for reconfiguring the logical structure; an optically reconfigurable connecting circuit serving as a connecting circuit for switching wiring connection of a logical signal input/output to the optically reconfigurable logical block, having a plurality of the optically reconfigurable bit elements that reconfigure the connecting structure thereof; and an optically reconfigurable input/output circuit, serving as an input/output circuit for switching the connection between an input/output terminal and the wiring, having a plurality of the optically reconfigurable bit elements for reconfiguring the connecting structure thereof; and the optically reconfiguring input/output circuit is arranged at least three vertexes of a quadrangular logical circuit chip on which the logical circuit is mounted.

With this structure, as mentioned above, the data is input to the optically reconfigurable gate array with the inspection pattern and the output state detection circuit detects the output from the logical circuit, thereby enabling the inspection and diagnosis of the write state with the optical signal by using an internal circuit of the optically reconfigurable gate array.

The optically reconfigurable input/output circuit is the closest to the input/output terminal and the optically reconfigurable bit element included in the optically reconfigurable input/output circuit first becomes the inspection target. Therefore, if the optically reconfigurable input/output circuit is on the three corners or four corners of the logical circuit chip, the write state of the optically reconfigurable bit element on the three corners or four corners of the logical circuit chip is first inspected. Thus, the logical circuit chip is first positioned so as to set, to be normal, the write state of the optically reconfigurable bit element on the three corners or four corners of the logical circuit chip. As a consequence, it is possible to perform the positioning of the optical unit that outputs the optical signal and the logical circuit chip with high precise and velocity.

As a second structure of the optically reconfigurable gate array according to the present invention, with the first structure, the output state detection circuit comprises: a voltage detection circuit that detects a voltage of the output terminal of a logical signal of the logical circuit; and a detection voltage applying circuit that applies a voltage not less than a logical threshold or voltage not more than the logical value to the output terminal of the logical signal of the logical circuit via a resistor.

As mentioned above, with the optically reconfigurable gate array write state inspection method according to the present invention, it is possible to execute the inspection of the optically reconfigurable bit element with the optical signal without integrating the inspection circuit in the logical circuit.

Further, with the write state inspection device of the optically reconfigurable gate array according to the present invention, the inspection circuit does not need to be integrated in the logical circuit. Thus, the mounting area of the circuit for inspecting the write state can be saved. In addition, it is possible to prevent such a condition that the circuit for inspecting the write state becomes a drawback upon improving the gate density of the optically reconfigurable gate array.

In addition, with the optically reconfigurable gate array according to the present invention, it is possible to inspect and examine the write state with the optical signal by using the internal circuit of the optically reconfigurable gate array. Therefore, the convenience can be improved upon positioning the optical unit that outputs the optical signal and the chip on which the optically reconfigurable gate array is mounted.

REFERENCE NUMERALS

1 optically reconfigurable gate array (ORGA)
2 VLSI unit (logical circuit chip)

Figure 1:
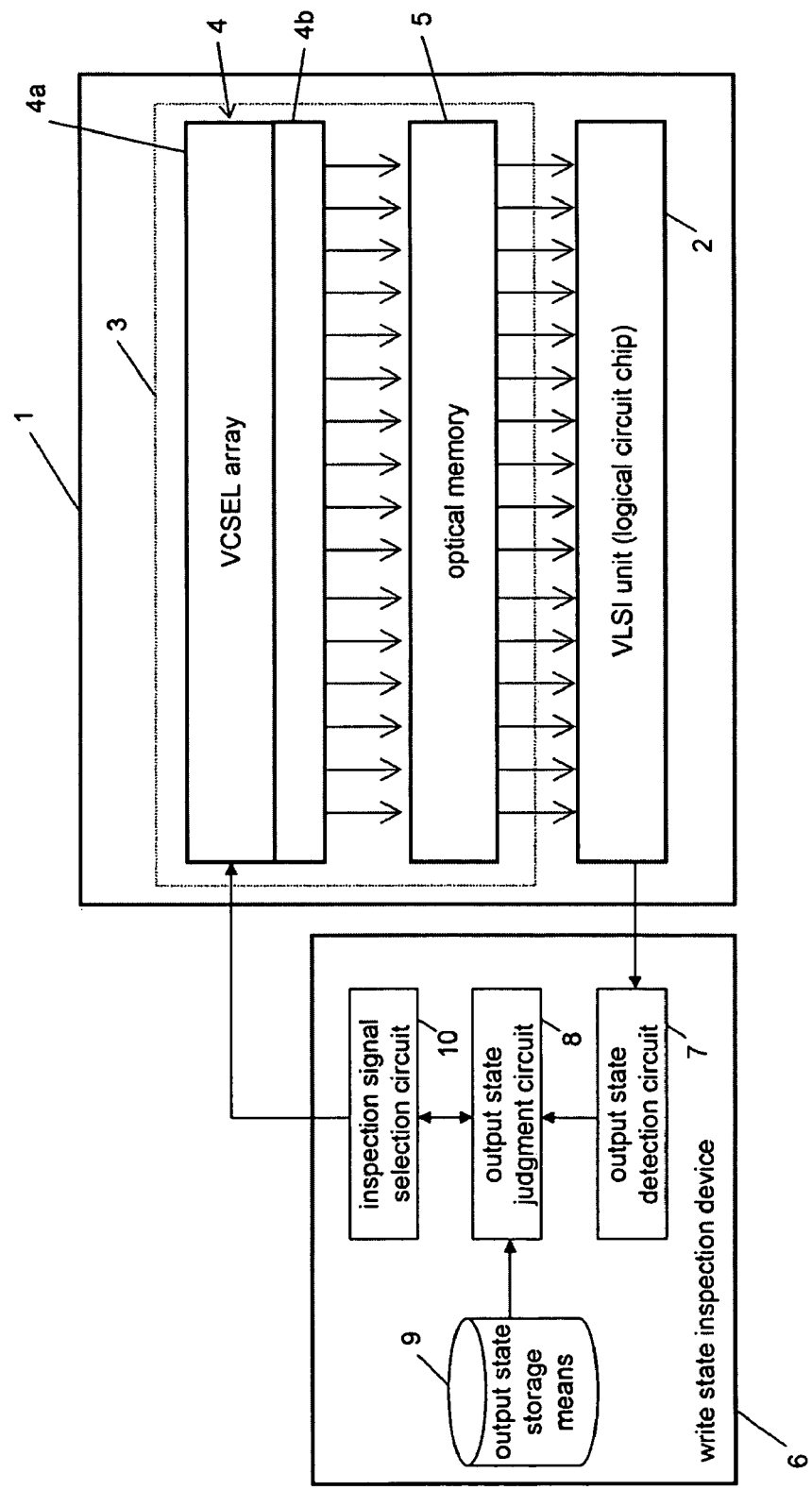
FIG. 1 is a diagram showing a write state inspection device of an optically reconfigurable gate array according to the first embodiment of the present invention.

3 optical unit
4 light irradiator
4a vertical cavity surface emitting lasers (VCSEL)
4b irradiation-angle control part
5 optical memory
6 write state inspection device
7 output state detection circuit
8 output state judgment circuit
9 output state storage means
10 inspection signal selection circuit
11 optically reconfigurable logical block (ORLB)
13 optically reconfigurable switching matrix (ORSM)
14 optically reconfigurable input/output block (ORIOB)
14a ORIOB for one input
15 wiring
20 multiplexer (MUX)
21 look-up table (LUT)
21a multiplexer
21b optically reconfigurable bit element
22 D flip-flop
23 multiplexer
24 tri-state buffer
25 multiplexer
30 four-directional switch
31 transmission gate
32 optically reconfigurable bit element
34 input/output terminal (IOB PAD)
35 tri-state buffer
35a optically reconfigurable bit element
36 multiplexer
37 multiplexer
38 tri-state buffer
39 voltage detection circuit
40 pull-up resistor
41 pull-up switch
42 pull-down resistor
43 pull-down switch
44 output buffer
45 load resistor
46 input buffer Detailed Description of Exemplary Embodiments First Embodiment FIG. 1 is a diagram showing a write state inspection device of an optically reconfigurable gate array according to the first embodiment of the present invention.

First, an optically reconfigurable gate array (Optically Reconfigurable Gate Array: hereinafter, referred to as an "ORGA") 1 serving as an inspection target of an information write state comprises a VLSI unit 2 and an optical unit 3.

Similarly to the FPGA, in the VLSI unit 2, reconfigurable logical circuits such as a logical block, wiring, connecting circuit, and input/output circuit are mounted on a semiconductor chip (logical circuit chip). However, unlike the FPGA, the ORGA 1 has the optically reconfigurable bit elements at individual positions of the logical circuits. An optical signal as information on the structure of the logical circuit is input from the optically reconfigurable bit element. The information on the configuration of the logical circuit is held in the optically reconfigurable bit element, and the logical circuits are reconfigured in accordance with the information on the configuration of the logical circuit.

The optical unit 3 comprises a light irradiator 4 and an optical memory 5. The light irradiator 4 emits light at a predetermined angle to the optical memory 5. The light irradiator 4 comprises a vertical cavity surface emitting laser (Vertical Cavity Surface Emitting Lasers: hereinafter, referred to as "VCSEL") 4a and an irradiation-angle control part 4b. Irradiation light from the VCSEL 4a is further emitted to the optical memory 5 by adjusting an irradiation angle thereof with the irradiation-angle control part 4b.

According to the first embodiment, the optical memory 5 uses a hologram memory. The hologram memory can read various recorded optical signal patterns in accordance with an angle of incident light. By changing the irradiation angle in accordance with the optical signal pattern to be read by the irradiation-angle control part 4b, the necessary optical signal pattern can be read and can be irradiated to the VLSI unit 2. The VLSI unit 2 reconfigures the logical circuits in accordance with the optical signal pattern irradiated from the optical unit 3.

The write state inspection device 6 according to the first embodiment inspects whether or not the information on the configuration of the logical circuits is normally written to the VLSI unit 2 from the optical unit 3 in the ORGA 1. The write state inspection device 6 comprises an output state detection circuit 7, an output state judgment circuit 8, an output state storage means 9, and an inspection signal selection circuit 10.

The inspection signal selection circuit 10 selects an optical signal pattern to be input to the logical circuit chip (VLSI unit 2). Actually, the inspection signal selection circuit 10 controls the irradiation-angle control part 4b in the light irradiator 4 to select the optical signal pattern to be read from the optical memory 5. The optical memory 5 stores in advance an inspection pattern for inspecting a write state. Therefore, the inspection signal selection circuit 10 selects the inspection pattern to be read from the optical memory 5, thereby selecting the optical signal pattern to the logical circuit chip (VLSI unit 2).

That is, according to the first embodiment, the inspection signal selection circuit 10 and the optical unit 3 are in corporation with each other, thereby realizing inspection-signal input means.

The output state detection circuit 7 is connected to input/output terminals of the logical circuit chip (VLSI unit 2). The output state detection circuit 7 detects whether the logical level of the input/output terminal is at the H level or L level, or whether or not the output impedance of the input/output terminal is high.

The output state judgment circuit 8 reads, from the output state storage means 9, the output state (hereinafter, referred to as an "output state at the normal writing time") of the input/output terminal upon normally writing the optical signal pattern selected by the inspection signal selection circuit 10 to the logical circuit chip (VLSI unit 2). Further, the output state judgment circuit 8 compares the output state of the output state detection circuit 7 with the output state at the normal writing time and thus judges whether or not the optical signal pattern is normally written to the logical circuit chip (VLSI unit 2).

Figure 2:
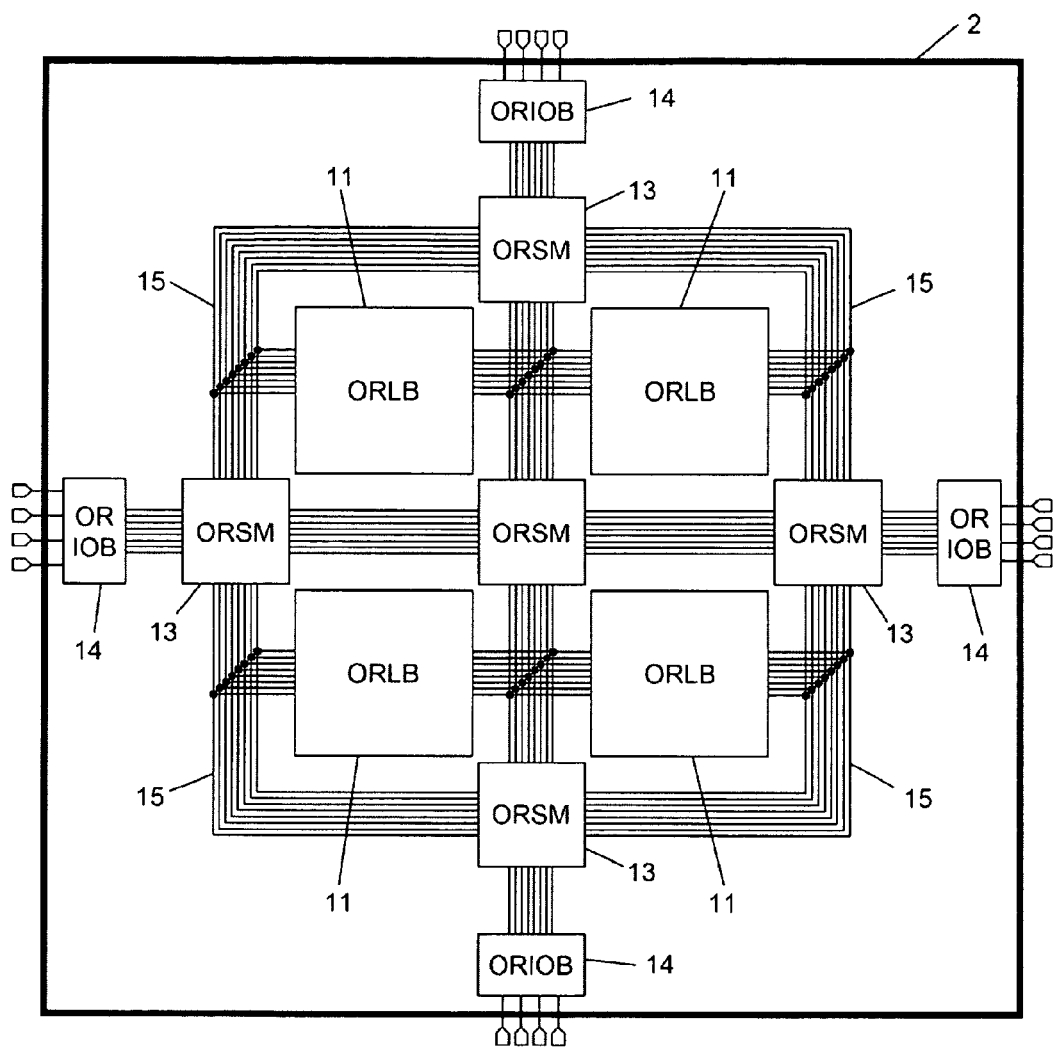
FIG. 2 is a diagram showing the circuit structure of a VLSI unit of ORGA.

FIG. 2 is a diagram showing the circuit structure of the VLSI unit 2 in the ORGA 1. The VLSI unit 2 comprises four optically reconfigurable logical blocks (Optically Reconfigurable Logic Blocks: hereinafter, referred to as "ORLB"s) 11, five optically reconfigurable switching matrixes (Optically Reconfigurable Switching Matrixes: hereinafter, referred to as "ORSM"s) 13, four optically reconfigurable input/output blocks (Optically Reconfigurable Input/Output Blocks: hereinafter, referred to as "ORIOB"s) 14, and wirings 15 that connect them.

The four ORLBs 11 are arranged at the vertex positions of a quadrangle. One ORSM 13 is arranged in the center of the quadrangle, and the four ORSMs 13 are arranged like the cross with the one ORSM 13 as center. The four outside ORSMs 13 are individually connected to the ORIOBs 14.

Figure 3:
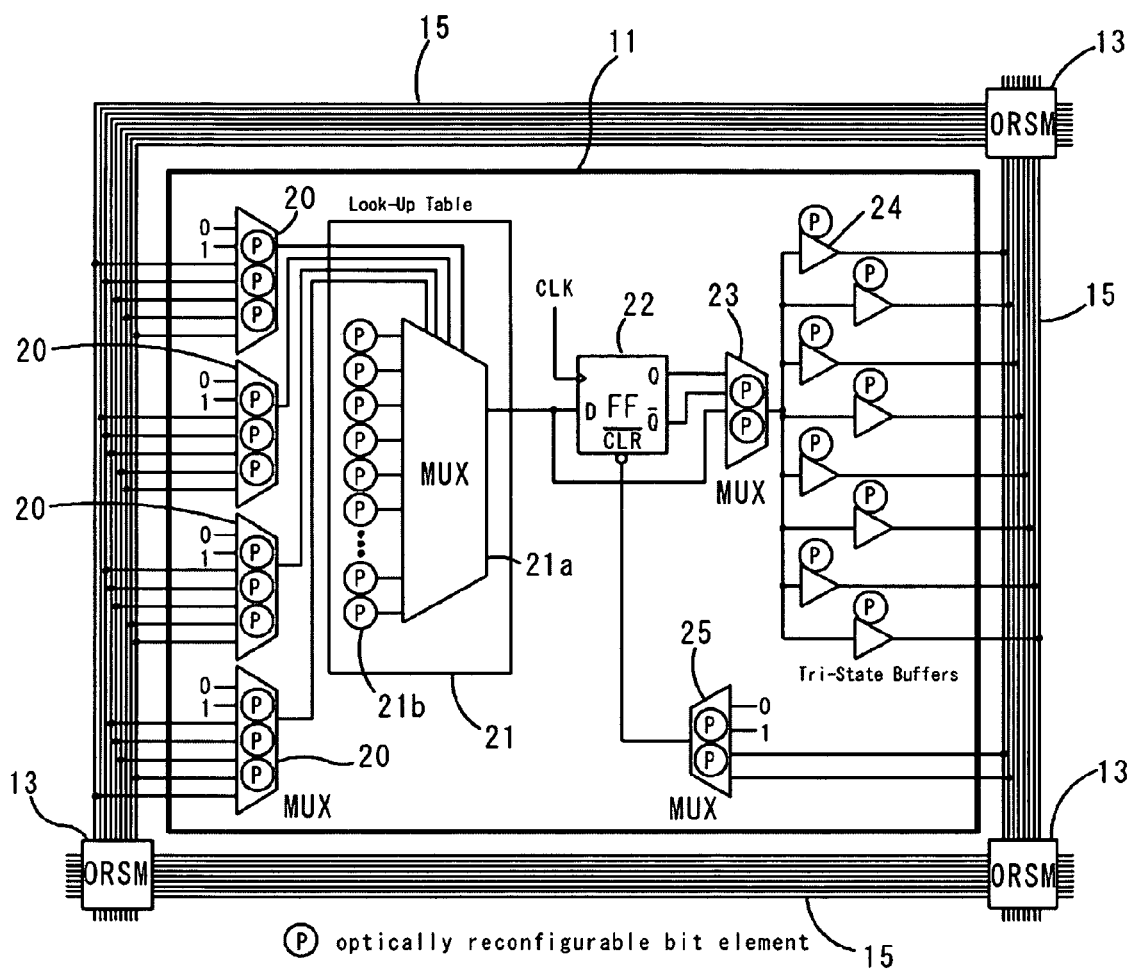
FIG. 3 is a diagram showing the circuit structure of an ORLB shown in FIG. 2.

FIG. 3 is a diagram showing the circuit structure of the ORLB 11 shown in FIG. 2. The ORLB 11 comprises four multiplexers (MUXs) 20 arranged to input units, a look-up table (LUT) 21 having four inputs and one output, a D flip-flop 22, a multiplexer 23 that switches an output of the D flip-flop 22, eight tri-state buffers (Tri-State Buffers) 24 arranged between output nodes of the multiplexer 23 and eight wirings 15, and a multiplexer 25 that switches a clear (CLR) signal of the D flip-flop 22. Further, the ORLBs 11 are connected to the wirings 15 via twenty-two inputs and eight outputs.

The multiplexers 20, 23, and 25 comprise the optically reconfigurable bit elements having photoelectrically converting circuits such as photodiodes, and detect the optical signal with the optically reconfigurable bit element, thereby switching the selection state.

The look-up table 21 comprises a multiplexer 21a having sixteen inputs and one output and sixteen optically reconfigurable bit elements 21b connected to selected input nodes of the multiplexer 21a. The state of the look-up table 21 is determined by the sixteen optically reconfigurable bit elements 21b. The selection input nodes of the multiplexer 21a are connected to the wirings 15 via four multiplexers 20 each having seven inputs and one output. A logical value 0, a logical value 1, and input values from the five wirings 15 are input to the seven selected input nodes of the multiplexer 20. The connection states of the multiplexer 20 are determined by the three optically reconfigurable bit elements.

The output node of the multiplexer 21a is directly connected to the D flip-flop 22. The D flip-flop 22 latches an output value from the multiplexer 21a. An output from the D flip-flop 22, an inverse output from the D flip-flop 22, and an output from the multiplexer 21a are input to selected input nodes of the multiplexer 23 having three inputs and one output at the latter stage of the D flip-flop 22. Further, the selection state of the multiplexer 23 is determined by the two optically reconfigurable bit elements.

The output node of the multiplexer 23 is connected to the wirings 15 via eight tri-state buffers 24. The optically reconfigurable bit element corresponding to one bit determines the connection or non-connection of the tri-state buffers 24.

The multiplexer 25 connected to the clear (CLR) node of the D flip-flop 22 selects a logical value 0, a logical value 1, and inputs corresponding to two bits from the wirings 15 with the two optically reconfigurable bit elements. Thus, the D flip-flop 22 can be initialized both by light and by an electrical circuit. Incidentally, upon turning on the power, the output of the multiplexer 25 is 0, thereby forcedly resetting the D flip-flop 22.

Herein, it is assumed that the logical value 0 and the logical value 1 are constantly input to the four multiplexers 20 serving as the input stages and the selected input node of the multiplexer 25, having the output values of the optically reconfigurable bit elements as the selection value inputs. Thus, the selection values are input as the optical signal patterns to the multiplexers 20 and the multiplexer 25. Further, the selection value input further enables the selection of the selected input node of the logical value 0 or logical value 1, thereby optically inputting an input variable of the optically reconfigurable logical block 15 by the multiplexer 20 or multiplexer 25.

Figure 4:
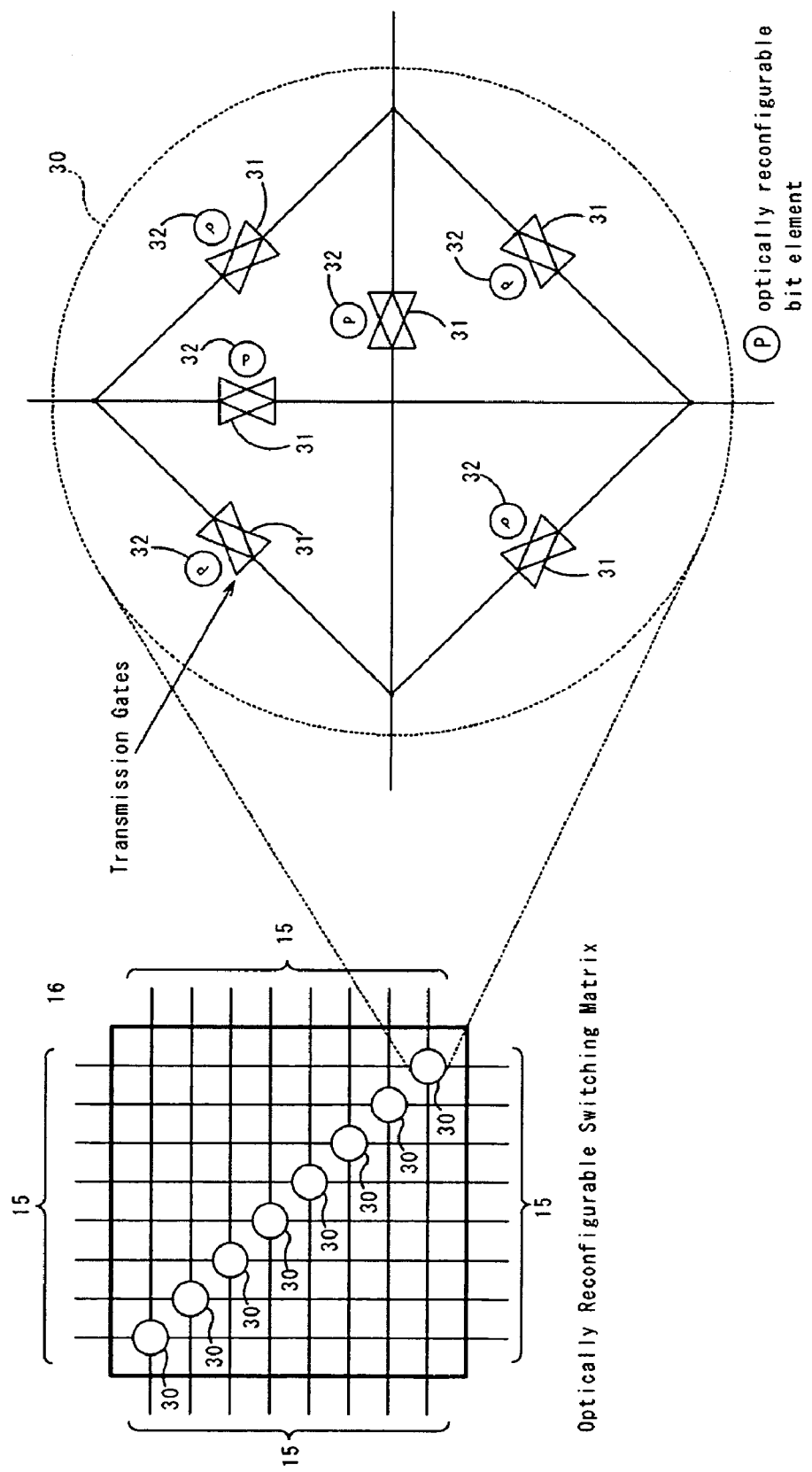
FIG. 4 is a diagram showing the circuit structure of an ORSM shown in FIG. 2.

FIG. 4 is a diagram showing the circuit structure of the ORSM 13 shown in FIG. 2. The ORSMs 13 are cross-bus switches arranged at the intersections of the eight writings 15 vertically and horizontally set as shown in FIG. 2, and individually have roles for connecting the vertically-intersected wirings. For one ORSM 13, eight four-directional switches 30 arranged at the intersections of the eight wirings are used. The four-directional switches 30 individually have six transmission gates 31, similarly to the existing FPGA. The transmission gates 31 individually have one-bit optically reconfigurable bit elements 32, and switch the optically reconfigurable bit elements 32 with the optical signals, thereby performing the on/off operation.

Figure 5:
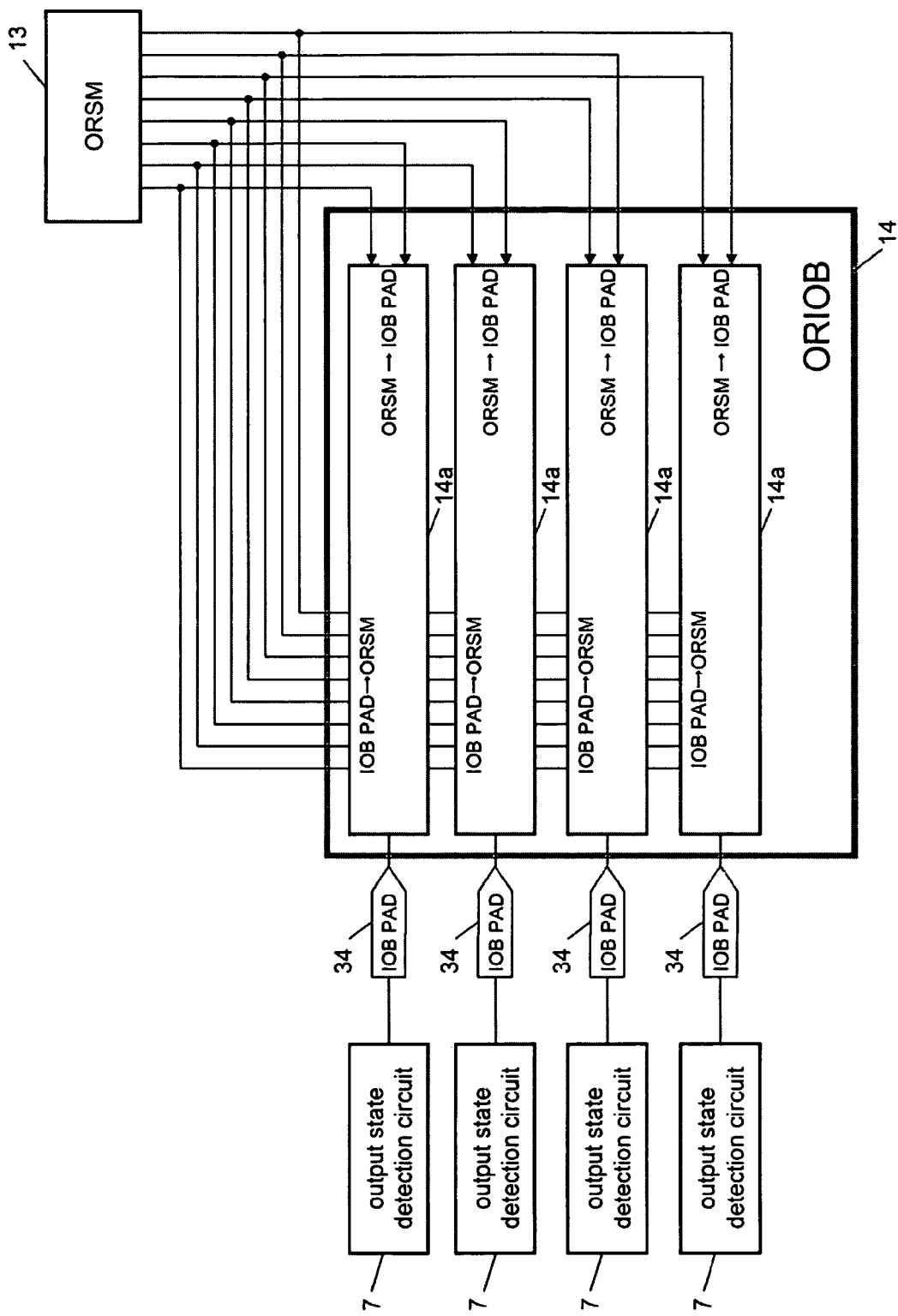
FIG. 5 is a diagram showing the circuit structure of an ORIOB shown in FIG. 2.

FIG. 5 is a diagram showing the circuit structure of the ORIOB 14 shown in FIG. 2. The ORIOBs 14 are connected first ends of four ORSMs 13 other than the ORSM 13 in the center of the logical circuit chip as shown in FIG. 2. The ORIOB 14 has four ORIOBs 14a for one input corresponding to four input/output terminals (input/output terminals 34). The ORIOBs 14a for one input have a role for connecting four input/output terminals (input/output terminals 34) to the eight wirings 15.

Further, the above-mentioned output state detection circuits 7 are connected to the input/output terminals 34.

Figure 6:
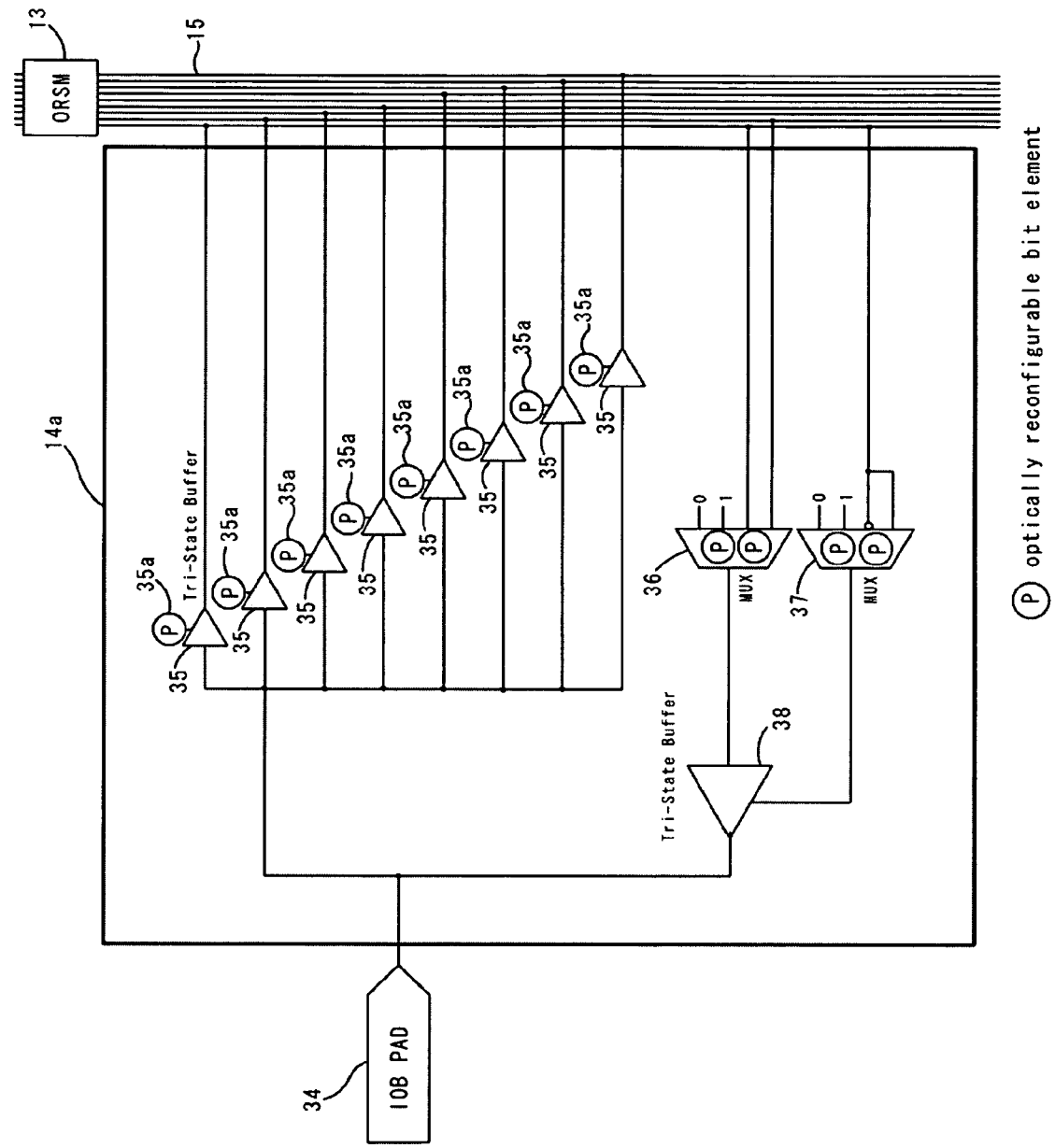
FIG. 6 is a diagram showing the circuit structure of an ORIOB for one input.

FIG. 6 is a diagram showing the circuit structure of the ORIOB 14a for one input. The ORIOBs 14a for one input are connected to first ends of the four ORSMs 13 other than the one ORSM 13 in the center of the logical circuit chip shown in FIG. 2. The ORIOBs 14a for one input have a role for connecting one input/output terminal (input/output terminal 34) to the eight wirings 15.

Referring to FIG. 6, an input circuit to the wirings 15 in the ORIOB 14a for one input comprises eight tri-state buffers 35 in which the input nodes thereof are connected to the input/output terminal 34 and the output nodes thereof are connected to any of the eight wirings 15. The tri-state buffer 35 has an optically reconfigurable bit element 35a corresponding to one bit and can control the on/off operation with an optical input.

Further, an output circuit to the input/output terminal 34 from the wiring 15 of the ORIOB 14a for one input comprises two multiplexers 36 and 37 and one tri-state buffer 38. The multiplexer 36 is a multiplexer having four inputs and one output, and signals of two wirings 15, a logical value 0, and a logical value 1 are input to the input node of the multiplexer 36. Further, the multiplexer 36 comprises optically reconfigurable bit elements corresponding to two bits, and selects any of signals input to the input node with optical input signals corresponding to two bits, thereby selecting any of signals input to the input node and outputting the selected signal to the output node. The output node of the multiplexer 36 is connected to the input node of the tri-state buffer 38, and the output node of the tri-state buffer 38 is connected to the input/output terminal 34.

The multiplexer 37 is a multiplexer having four inputs and one output. A positive logical signal and a negative logical signal of one wiring 15, a logical value 0, and a logical value 1 are input to the input nodes of the multiplexer 37. The multiplexer 37 has optically reconfigurable bit elements corresponding to two bits, and selects any of signals input to the input nodes thereof and outputs the selected signal to the output node with optical input signals corresponding to two bits. The output node of the multiplexer 37 is connected to an enable input node of the tri-state buffer 38. Upon turning on the power, the logical value 0 is output to the enable input node of the tri-state buffer 38, and all the input/output terminals 34 have high impedances.

Herein, the logical value 0 and logical value 1 are constantly input to selected input nodes of the multiplexer 36 and 37 having the output values of the optically reconfigurable bit elements as inputs of the selection values. Thus, the selection values are input as the optical signal patterns to the multiplexers 36 and 37, thereby selecting the selected input node of the logical value 0 or logical value 1. Accordingly, the multiplexer 36 or multiplexer 37 can optically input an input variable of the ORIOB 14.

Figure 7:
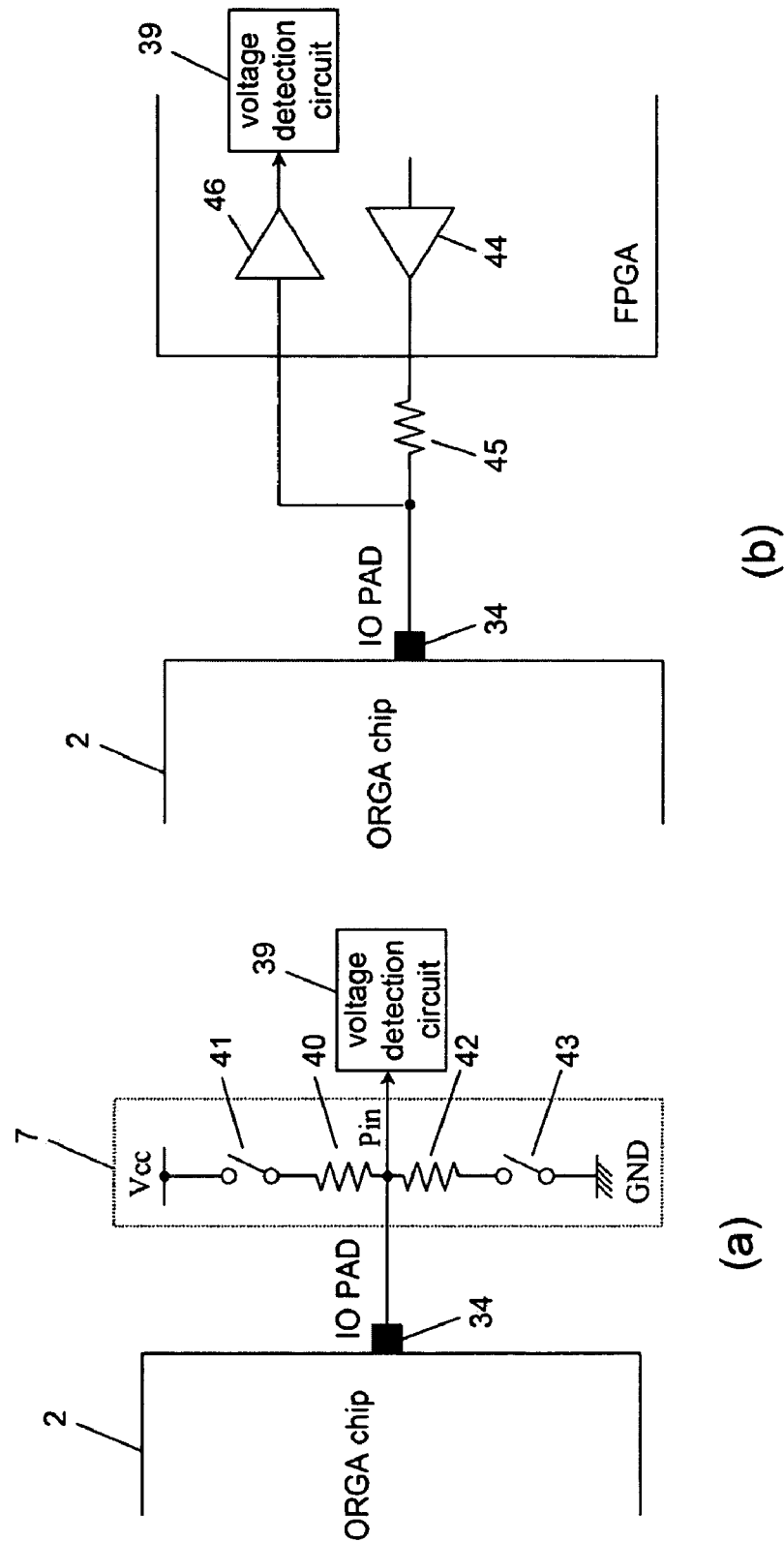
FIG. 7 is a diagram showing an example of the circuit structure of an output state detection circuit.

FIG. 7 is a diagram showing examples of the circuit structure of the output state detection circuit 7. The output state detection circuit 7 shown in FIG. 7(a) comprises a voltage detection circuit 39, a pull-up resistor 40, a pull-up switch 41, a pull-down resistor 42, and a pull-down switch 43.

The pull-up switch 41 is set to be in the ON state and the pull-down switch 43 is set to be in the OFF state (hereinafter, this state is referred to as a "pull-up state"). A power voltage Vcc higher than a logical threshold voltage is applied to the input/output terminal 34 via the pull-up resistor 40. Further, the pull-down switch 43 is set to be in the ON state and the pull-up switch 41 is set to be in the OFF state (hereinafter, this state is referred to as a "pull-down state"), and a ground voltage GND lower than a logical threshold voltage is applied to the input/output terminal 34 via the pull-down resistor 42. The pull-up resistor 40 and pull-down resistor 42 have substantially high resistances.

As mentioned above, in the output state detection circuit 7 shown in FIG. 7(a), the pull-up resistor 40, the pull-up switch 41, the pull-down resistor 42, and the pull-down switch 43 structure a detection voltage applying circuit.

When the logical signal output from the input/output terminal 34 is at the H level or L level, irrespective of the pull-up state and the pull-down state, the voltage of the input/output terminal 34 is at the H level or L level. On the other hand, when the output impedance of the input/output terminal 34 is the high impedance, in the pull-up state, the voltage of the input/output terminal 34 is Vcc (H level) and, in the pull-down state, the voltage of the input/output terminal 34 is GND (L level).

Therefore, by switching the pull-up state and the pull-down state, the voltage of the input/output terminal 34 in each state is detected by the voltage detection circuit 39. As a consequence, it is possible to detect whether the output state of the input/output terminal 34 is at the H level, L level, or high impedance. The voltage detection circuit 39 can use the structure having a reference voltage generating circuit and a comparator and the structure for digitizing a voltage value with an AD converter and comparing the digital value with a reference value.

Incidentally, a circuit equivalent to the output state detection circuit 7 shown in FIG. 7(a) can be structured as shown in FIG. 7(b). Referring to FIG. 7(b), the output from the output buffer 44 in the FPGA is connected to the input/output terminal 34 via a load resistor 45. Further, the input/output terminal 34 is connected to the voltage detection circuit 39 structured in the FPGA via an input buffer 46 in the FPGA. An output voltage of the output buffer 44 is applied to the input/output terminal 34 via the load resistor 45. Therefore, by outputting the H level or L level from the output buffer 44, the above-mentioned pull-up state or pull-down state can be realized.

According to the first embodiment, the output state detection circuit 7 is externally connected to the logical circuit chip via the input/output terminal 34. Alternatively, the output state detection circuit 7 may be arranged in the logical circuit chip.

Figure 8:
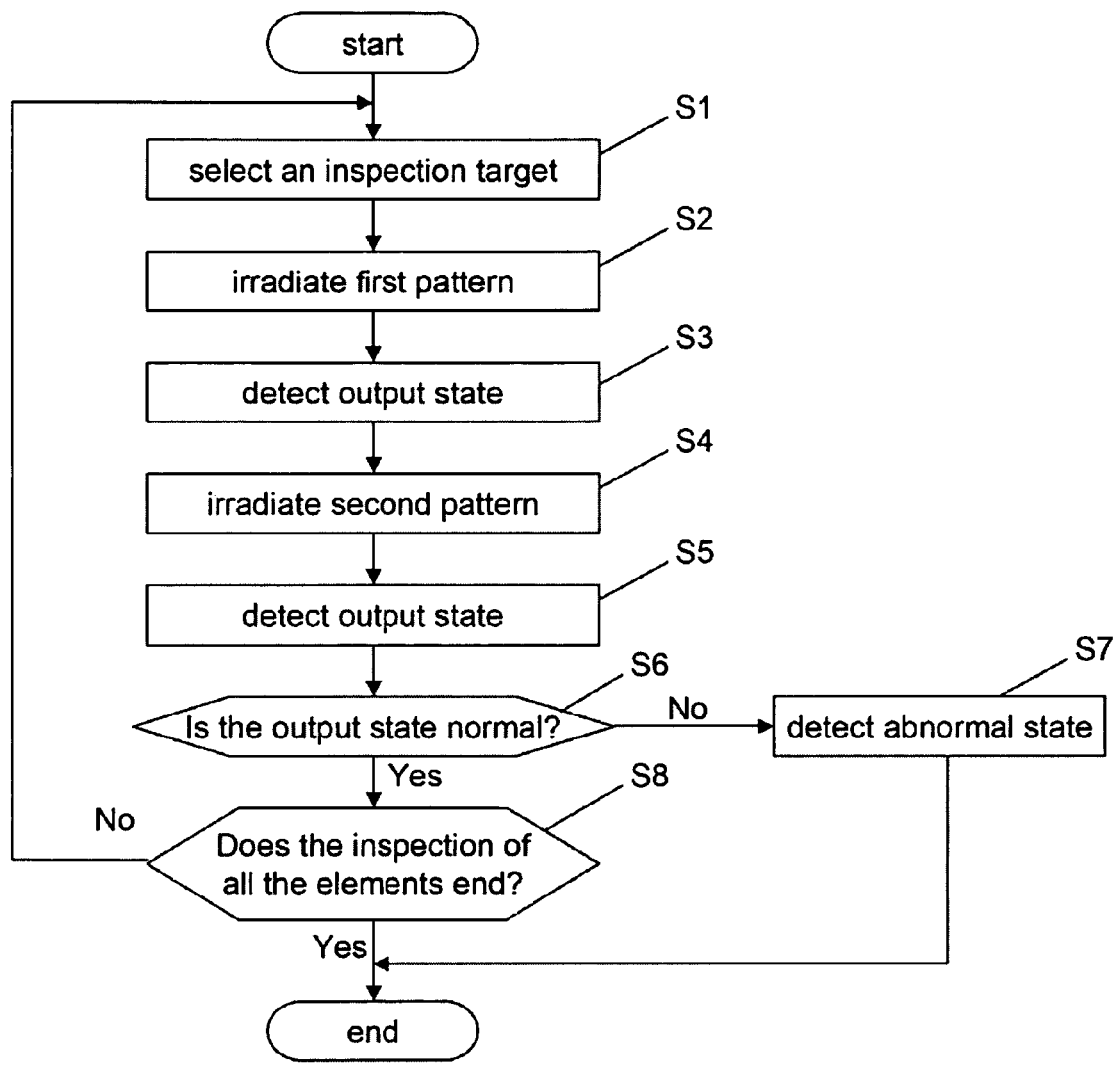
FIG. 8 is a flowchart showing the flow of a write state inspection method according to the first embodiment.

Next, a description will be given of a write state inspection method with the above-mentioned write state inspection device 6. FIG. 8 is a flowchart showing the flow of the write state inspection method according to the first embodiment.

First, the optically reconfigurable bit element as an inspection target is selected (S1). This is performed by actually selecting the optical signal pattern (inspection pattern) for inspection stored in the optical memory in accordance with the determined order by the inspection signal selection circuit 10.

Herein, with respect to the selection of the optically reconfigurable bit element as the inspection target, in order to configure the logical structure of the logical circuit chip so that the input/output terminal 34 is changed upon switching the optical signal irradiated to the optically reconfigurable bit element from the OFF state to the ON state (or inversely), the optically reconfigurable bit elements to which the optical signal does not need to be input except for the corresponding optically reconfigurable bit element or the optically reconfigurable bit elements whose inspection of the write state entirely ends except for the corresponding optically reconfigurable bit element to which the optical signal needs to be input are sequentially selected. Because, if there is the optically reconfigurable bit element whose inspection of the write state does not end in the inspection circuit upon inspecting the optically reconfigurable bit element as the inspection target, it cannot be determined whether or not the write state of the optically reconfigurable bit element as the inspection target is normal.

The inspection signal selection circuit 10 selects a first inspection pattern for the optically reconfigurable bit element as the inspection target, and the VLSI unit 2 is irradiated from the optical unit 3 with light (S2). Herein, as the first inspection pattern, an optical signal pattern for configuring, to the logical circuit chip, a logical circuit for inspection that changes depending on the input of the optical signal for the optically reconfigurable bit element having the output state of the input/output terminal 34 of the logical circuit chip as the inspection target, that is, an optical signal pattern having the optical signal, as an off-signal, irradiated to the optically reconfigurable bit element as an inspection target is used.

Subsequently, the output state detection circuit 7 detects the output state of the input/output terminal 34 (S3). As mentioned above, the H-level voltage or L-level voltage is applied to the input/output terminal 34 via the load resistor 45 (pull-up resistor 40 or pull-down resistor 42) and, in the cases, the voltage detection circuit 39 detects the voltage of the input/output terminal 34.

The output state judgment circuit 8 judges the output state of the input/output terminal 34 by a change pattern of the voltage of the detected input/output terminal 34. Specifically, when the voltage applied to the input/output terminal 34 via the load resistor 45 (pull-up resistor 40 or pull-down resistor 42) is changed from the H level to the L level, the output state judgment circuit 8 judges, if the voltage of the input/output terminal 34 always keeps the H level, that the input/output terminal 34 is in the H-level output state, if the voltage of the input/output terminal 34 always keeps the L level, that the input/output terminal 34 is in the L-level output state and, if the voltage of the input/output terminal 34 is changed from the H level to the L level, that the input/output terminal 34 is in the high impedance state. The output state judgment circuit 8 compares the output states of the input/output terminal 34 obtained in this case with the output states of the input/output terminal 34 stored in the output state storage means 9, and judges whether or not both the output states match.

Subsequently, the inspection signal selection circuit 10 selects a second inspection pattern for the optically reconfigurable bit element as the inspection target, and the optically reconfigurable bit element is irradiated with light from the optical unit 3 (S4). Herein, as the second inspection pattern, an optical signal pattern for setting the ON-state of the optical signal irradiated to the optically reconfigurable bit element as the inspection target in the first optical signal pattern is used.

Further, similarly to step S3, the output state detection circuit 8 detects the output state of the input/output terminal 34, and the output state judgment circuit 8 compares the output state of the input/output terminal 34 with the normal output state of the input/output terminal 34 stored in the output state storage means 9 and judges whether or not both the states match (S5).

If the result of the above processing in any of steps S3 and S5 indicates that the output state of the input/output terminal 34 does not match the normal output state of the input/output terminal 34 stored in the output state storage means 9 (S6), the output state judgment circuit 8 judges that the optical signal is normally written to the optically reconfigurable bit element as the inspection target and outputs an abnormal signal (S7), and the operation stops.

On the other hand, if it is determined in steps S3 and S5 that the output state of the input/output terminal 34 matches the normal output state of the input/output terminal 34 stored in the output state storage means 9 (S6) and if the inspection of all the optically reconfigurable bit elements does not end (S8), the processing procedure returns to step S1. If the inspection of all the optically reconfigurable bit elements ends (S8), the operation ends.

Incidentally, according to the first embodiment, the logical circuit chip is irradiated in order of the first inspection pattern and the second inspection pattern. Alternatively, the order may be inversed.

Finally, examples will be given of the inspection of the output state of the optically reconfigurable bit element according to the above-mentioned method.

EXAMPLE 1

Figure 9:
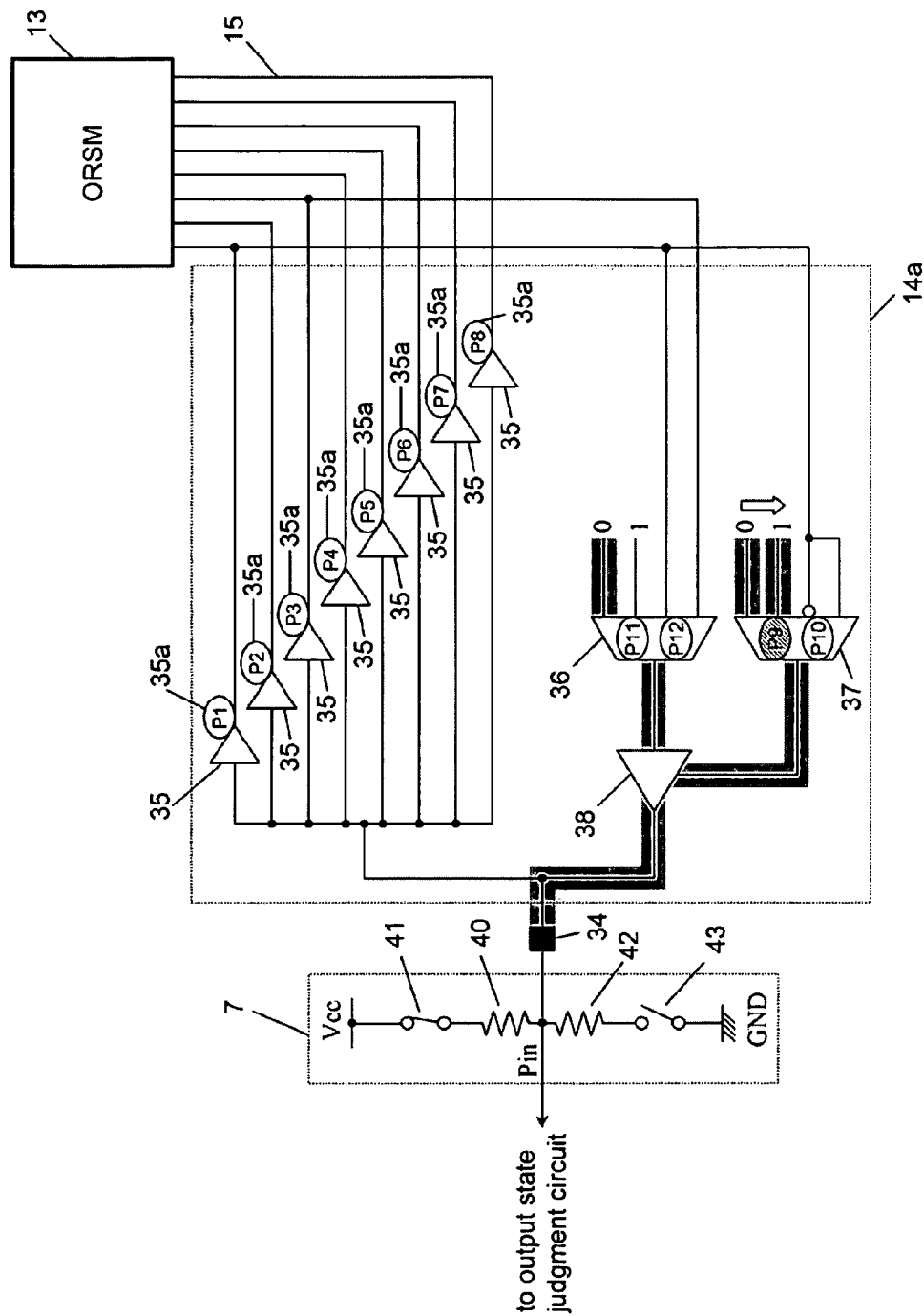
FIG. 9 is an explanatory diagram in the case of inspecting an information write state of an optically reconfigurable bit element P9 in the ORIOB for one input.

The case of inspecting the write state of the information to the optically reconfigurable bit element P9 in the ORIOB 14a for one input will be described with reference to FIG. 9. In this case, the optically reconfigurable bit elements P1 to P8 and P10 to P12 are always set to be in the OFF state, the optically reconfigurable bit element P9 is set to be in the OFF-state with the first inspection pattern and the optically reconfigurable bit element P9 is set to be in the ON-state with the second inspection pattern.

If the first inspection pattern is irradiated, the optically reconfigurable bit element P9 is in the OFF-state and the multiplexer 37 outputs data 0. Therefore, the output of the tri-state buffer 38 is the high impedance. Further, the input impedance of eight tri-state buffers 35 on the input side is high. Therefore, the output state of the input/output terminal 34 is high. Thus, the output state detection circuit 7 detects the high impedance.

Subsequently, if the second inspection pattern is irradiated, the optically reconfigurable bit element P9 is in the ON-state and the multiplexer 37 outputs data 1. Furthermore, the multiplexer 36 outputs data 0. The tri-state buffer 38 outputs a value of the multiplexer 36. Therefore, the output state of the input/output terminal 34 is set to be in the L-level state. The output state detection circuit 7 detects the L-level state.

Therefore, if the first inspection pattern and the second inspection pattern are sequentially irradiated and when the output state of the input/output terminal 34 is changed from the high impedance to the L-level state, it is determined that the state of the write state of the information of the optically reconfigurable bit element P9 is normal. Except for this, it is determined that the write state of the information of the optically reconfigurable bit element P9 is not normal.

EXAMPLE END

EXAMPLE 2

Figure 10:
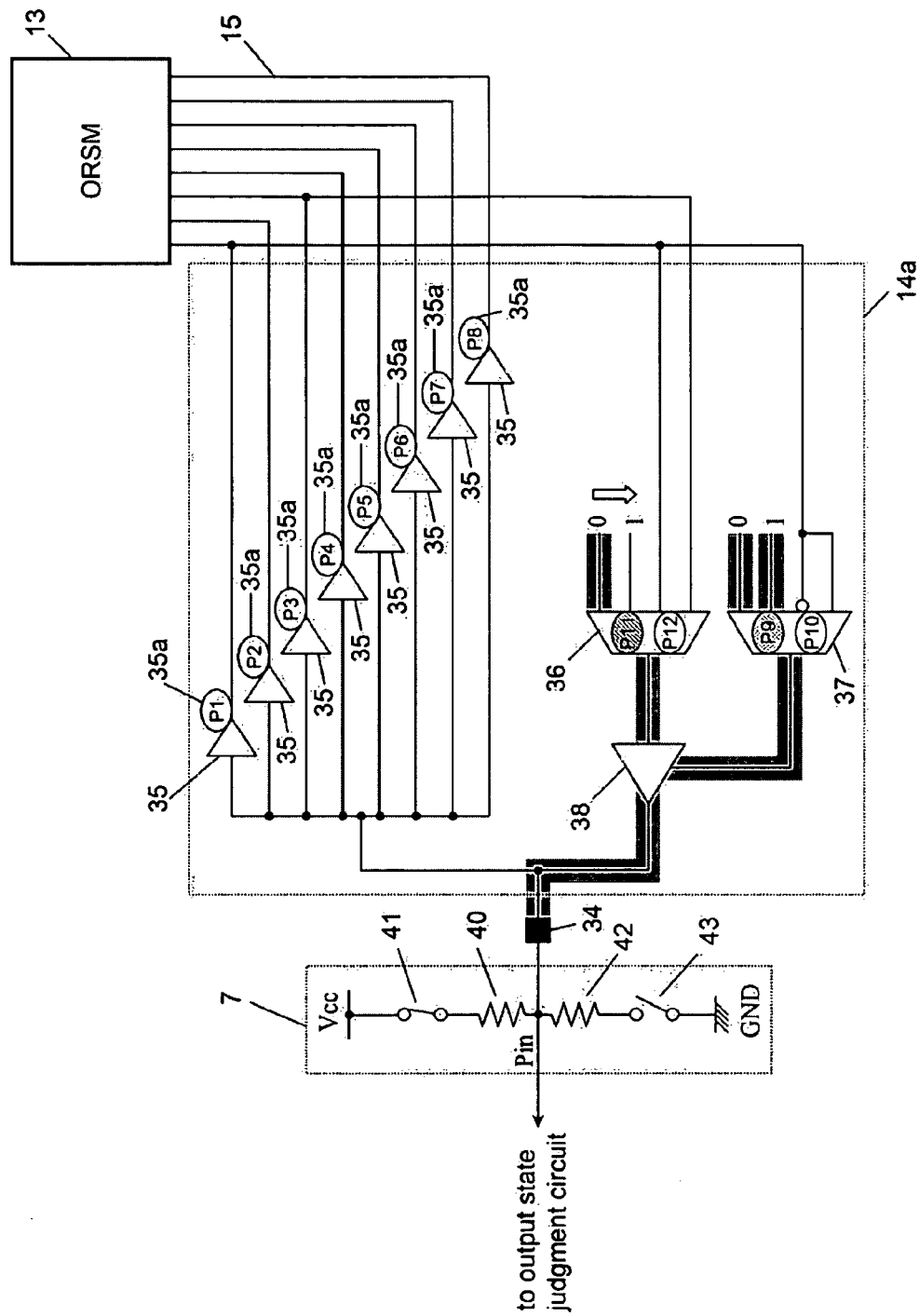
FIG. 10 is an explanatory diagram in the case of inspecting an information write state of an optically reconfigurable bit element P11 in the ORIOB for one input.

The case of inspecting the normal write state of the information to the optically reconfigurable bit element P9 in the ORIOB 14a for one input will be described with reference to FIG. 10. In this case, the optically reconfigurable bit elements P1 to P8 and P10 to P12 are always set to be in the OFF-state, the optically reconfigurable bit element P9 is set to be in the ON-state with the first inspection pattern and the optically reconfigurable bit element P11 is set to be in the OFF-state with the first inspection pattern and is set to be in the ON-state with the second inspection pattern.

Since the optically reconfigurable bit element P9 is always in the ON-state, the multiplexer 37 always outputs data 1. Therefore, the tri-state buffer 38 always outputs the output value of the multiplexer 36.

If the first inspection pattern is irradiated, the optically reconfigurable bit element P11 is in the OFF-state and the multiplexer 36 outputs data 0. Therefore, the tri-state buffer 38 outputs the L level and the output state of the input/output terminal 34 enters the L-level state. Thus, the output state detection circuit 7 detects the L-level state.

Subsequently, if the second inspection pattern is irradiated, the optically reconfigurable bit element P11 is in the ON-state and the multiplexer 36 outputs data 1. Therefore, the tri-state buffer 38 outputs the H level and the output state of the input/output terminal 34 enters the H-level state. Thus, the output state detection circuit 7 detects the H-level state.

Therefore, if the first inspection pattern and the second inspection pattern are sequentially irradiated and when the output state of the input/output terminal 34 is changed from the L-level state to the H-level state, it is determined that the information write state of the optically reconfigurable bit element P11 is normal. Except for this, it is determined that the information write state of the optically reconfigurable bit element P11 is not normal.

EXAMPLE END

EXAMPLE 3

Figure 11:
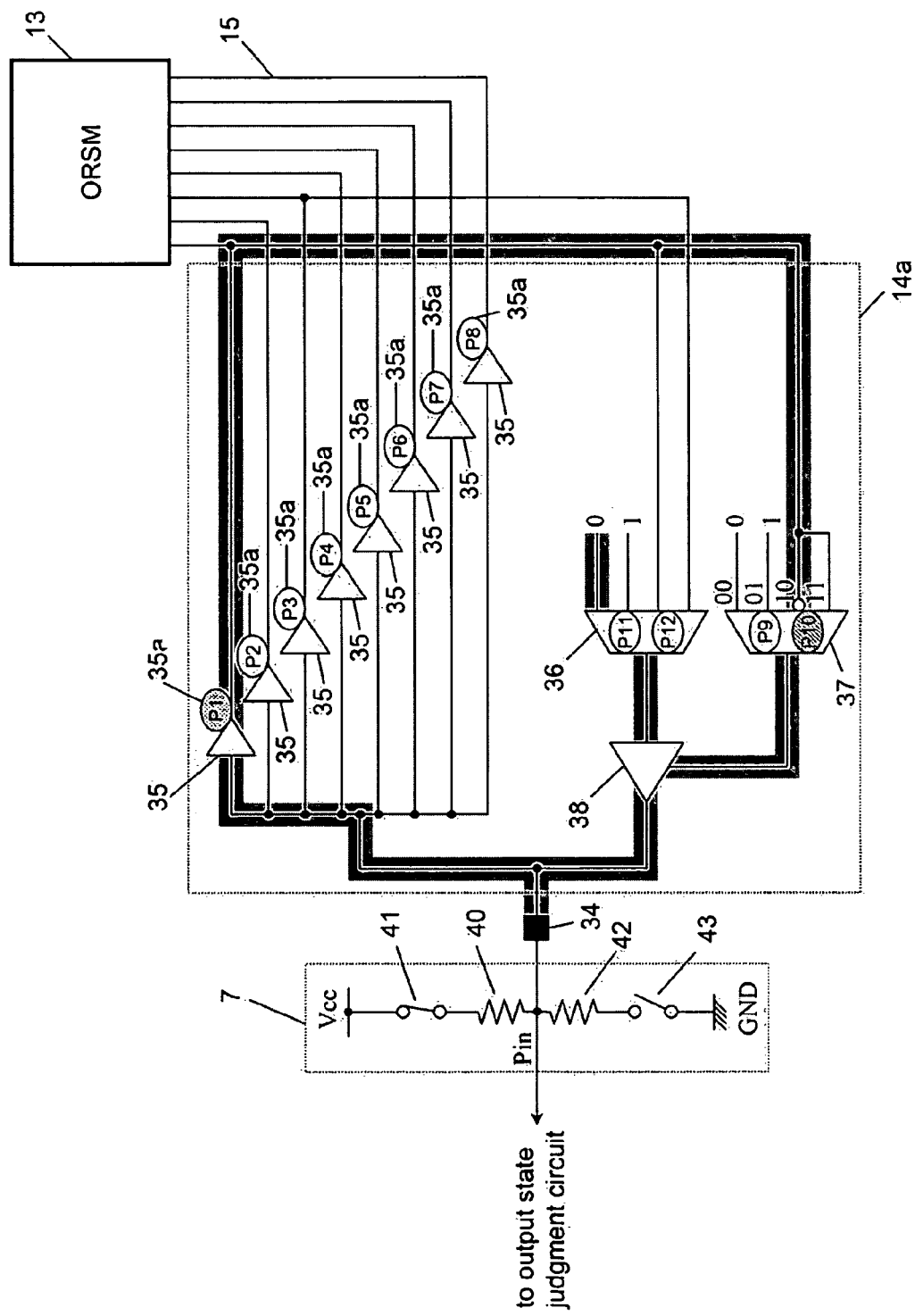
FIG. 11 is an explanatory diagram in the case of inspecting an information write state of an optically reconfigurable bit element P10 in the ORIOB for one input.

The case of inspecting the information write state of the optically reconfigurable bit element P10 in the ORIOB 14a for one input will be described with reference to FIG. 11. In this case, it is assumed that the information write state of the optically reconfigurable bit element P1 is normal and the inspection is executed.

First, in the state in which light is not emitted to the logical circuit chip, the output state detection circuit 7 sets the pull-up switch 41 to OFF and further sets the pull-down switch 43 to ON. In this case, the output of the tri-state buffer 38 is in the high-impedance state. Therefore, the output state of the input/output terminal 34 enters the L level.

Subsequently, the first inspection pattern is irradiated to the logical circuit chip. The first inspection pattern uses an optical signal pattern to irradiate only the optically reconfigurable bit element P1 with light. Since it is now assumed that the information write state of the optically reconfigurable bit element P1 is normal, the first inspection pattern is irradiated, thereby setting the tri-state buffer 35 of the optically reconfigurable bit element P1 to be in the ON state. Thus, the output of the tri-state buffer 35 of the optically reconfigurable bit element P1 becomes the L level.

Subsequently, the first inspection pattern is irradiated to the logical circuit chip. The second inspection pattern uses an optical signal pattern to irradiate only the optically reconfigurable bit elements P1 and P10 with light. If the information write state of the optically reconfigurable bit element P10 is normal, the multiplexer 37 select an input terminal "10". The output value from the tri-state buffer 35 of the optically reconfigurable bit element P1 is inversely input to the input terminal "10". Therefore, the output value of the multiplexer 37 becomes the H level. Further, the output from the tri-state buffer 38 is changed from the high impedance state to the L-level state.

In this state, the pull-down switch 43 of the output state detection circuit 7 is set to OFF and the pull-up switch 41 is set to ON. If the information write state of the optically reconfigurable bit element P10 is normal, the output value of the tri-state buffer 38 is at the L level. Therefore, the input/output terminal 34 keeps the L level. However, if the information is not written to the optically reconfigurable bit element P10, the output state of the tri-state buffer 38 is still in the high-impedance state. The level of the input/output terminal 34 is pulled-up, thereby becoming the H level. Thus, the information write state of the optically reconfigurable bit element P10 can be inspected.

In this case, the optically reconfigurable bit element P1 needs additional inspection of the information write state.

EXAMPLE END

EXAMPLE 4

Next, a description will be given of an example of inspecting the write state of the optically reconfigurable bit element in the ORSM 13. It is assumed to completely end the inspection of the write state of the optically reconfigurable bit elements in the ORIOBs 14.

Figure 12:
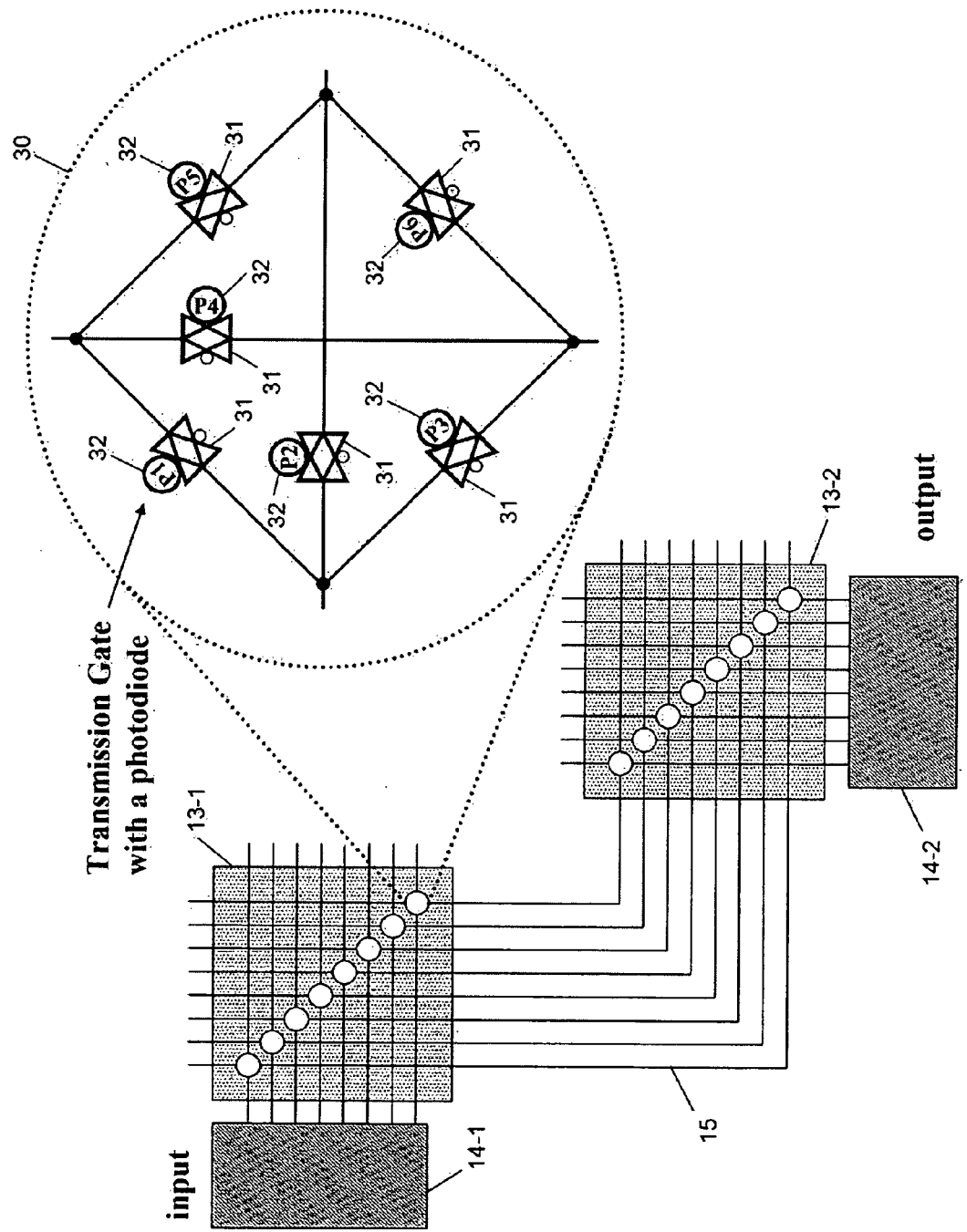
FIG. 12 is an explanatory diagram in the case of inspecting the information write state of an optically reconfigurable bit element of the ORSM.

Referring to FIG. 12, upon inspecting the write state of the optically reconfigurable bit element in the ORSM 13, the write state of two ORSMs 13 as one set is inspected. As shown in FIG. 12, in order to distinguish the two ORSMs 13, reference numerals 13-1 and 13-2 denote the ORSMs 13.

The four-directional switch 30 in the ORSM 13 includes six transmission gates 31. The transmission gates 31 have the optically reconfigurable bit elements for on/off operation of the gate. Reference numerals P1 to P6 denote the optically reconfigurable bit elements, as shown in FIG. 12.

Upon inspecting the write state of the optically reconfigurable bit element P3, first, all inputs from the ORIOB 14-1 to the ORSM 13-1 are set at the L level. In this state, light is emitted only to the optically reconfigurable bit elements P3 in the ORSMs 13-1 and 13-2, and an optical signal pattern to prevent the light emission to other optically reconfigurable bit elements is irradiated. If the information write state of the optically reconfigurable bit elements P3 in the ORSMs 13-1 and 13-2 is normal, the voltages of the input/output terminal 34 of the ORIOB 14-2 are at the L level. Subsequently, all the inputs from the ORIOB 14-1 to the ORSM 13-1 are at the H level, and it is checked that the voltages of the input/output terminal 34 in the ORIOB 14-2 are at the H level. As a consequence, it is detected that the information write state is normal. If any of the information write states of the optically reconfigurable bit elements P3 in the ORSMs 13-1 and 13-2 is not normal, it is determined that the voltage of the input/output terminal 34 in the ORIOB 14-2 is not changed from the L level to the H level. Thus, it is detected that the information write state is not normally performed.

EXAMPLE END

EXAMPLE 5

Next, a description will be given of an example of inspecting the write state of the optically reconfigurable bit element in the ORLB 11. It is assumed to completely end the inspection of the write states of the optically reconfigurable bit elements in the ORIOB 14 and the ORSM 13.

Figure 13:
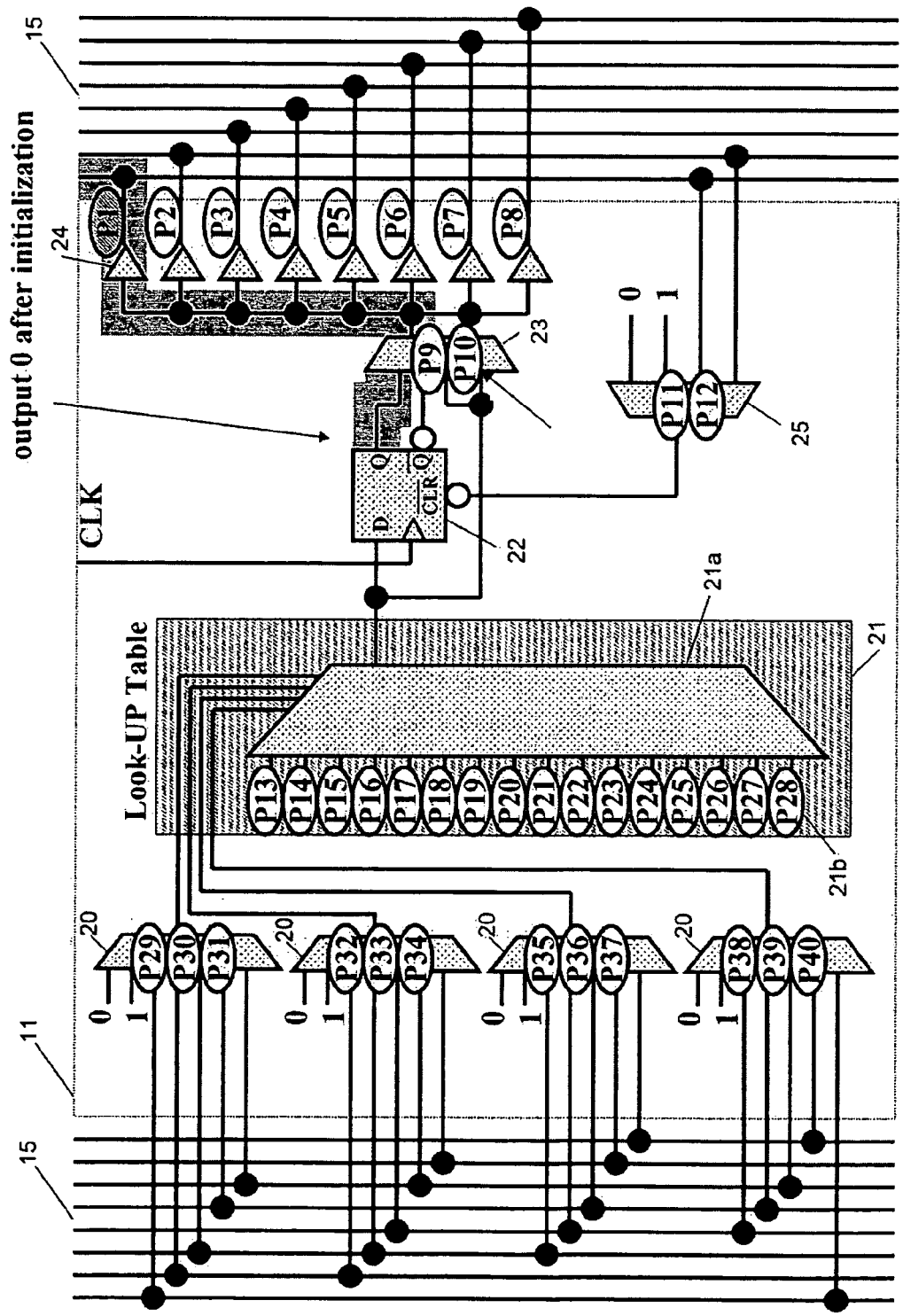
FIG. 13 is an explanatory diagram in the case of inspecting the information write state of the optically reconfigurable bit element in the ORLB.

First, reference numerals P1 to P40 denote the optically reconfigurable bit elements of one ORLB11, as shown in FIG. 13. Herein, the write state of the optically reconfigurable bit element P1 is inspected.

First, in the state in which light is not emitted, the L level is inversely input to the clear terminal of the D flip-flop 22. Thus, the D flip-flop 22 is cleared and the L level is output from an output terminal Q. Further, the multiplexer 23 selects the output from the D flip-flop 22 and the multiplexer 23 therefore outputs the L level. However, since the optically reconfigurable bit element P1 is in the OFF-state, the output of the tri-state buffer 24 of the optically reconfigurable bit element P1 is in the high-impedance state.

In this state, an optical signal pattern to input the optical signal only to the optically reconfigurable bit element P1 is irradiated. If the information write state of the optically reconfigurable bit element P1 is normal, the output of the tri-state buffer 24 of the optically reconfigurable bit element P1 becomes the L level. On the other hand, if the information write state of the optically reconfigurable bit element P1 is not normal, the output of the tri-state buffer 24 of the optically reconfigurable bit element P1 is kept to be in the high-impedance state. Therefore, the output of the tri-state buffer 24 of the optically reconfigurable bit element P1 is pulled-out to the input/output terminal 34 via the ORSM 13 and the ORIOB 14, and the change of the output state is detected by the output state detection circuit 7, thereby inspecting the write state of the optically reconfigurable bit element P1. Herein, it is assumed that the bus in the ORGA wiring channel is pulled up.

EXAMPLE END

EXAMPLE 6

Figure 14:
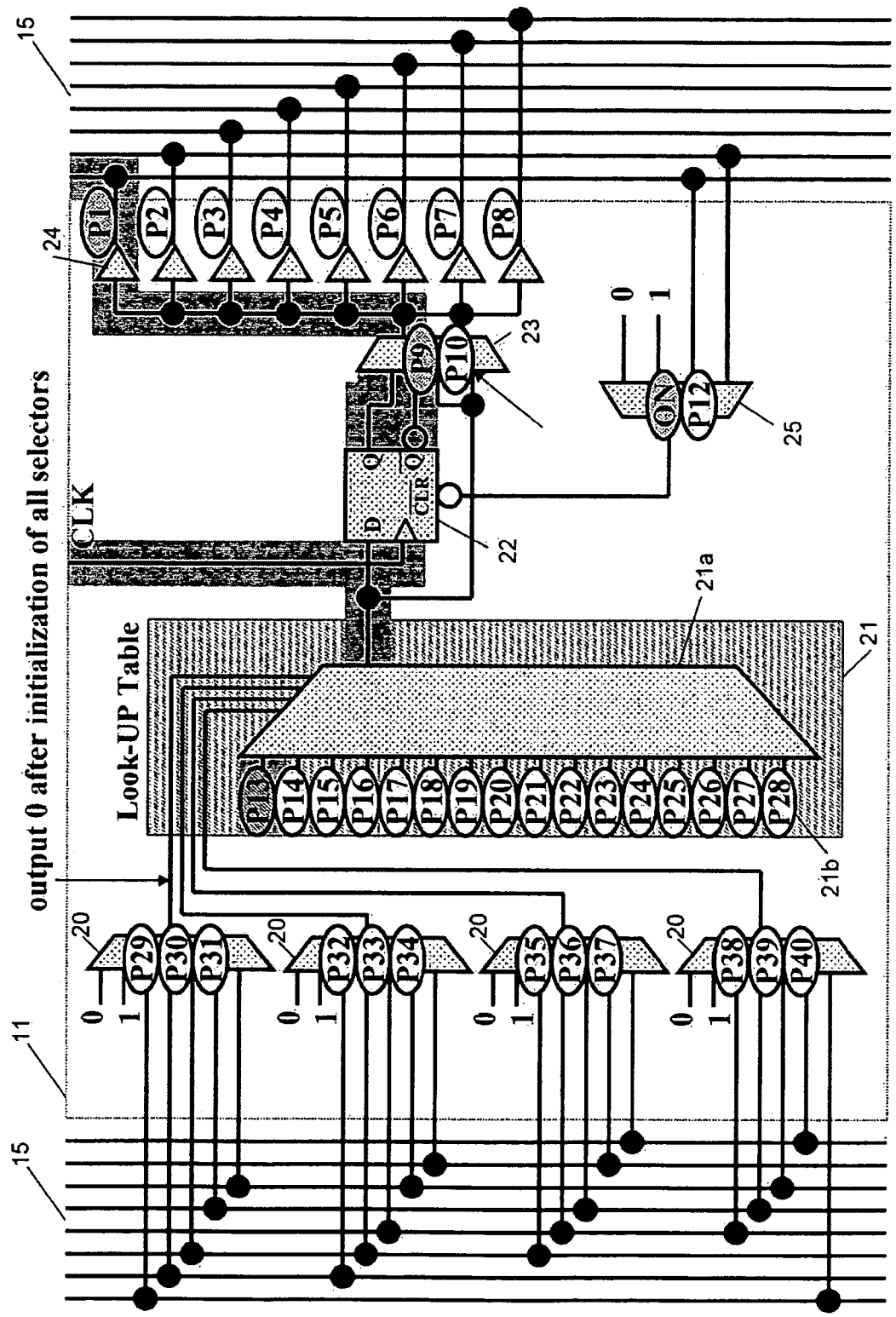
FIG. 14 is an explanatory diagram in the case of inspecting the information write state of the optically reconfigurable bit element in the ORLB.

Referring to FIG. 14, if the write state of the optically reconfigurable bit element P13 is inspected after ending the inspection of the write states of the optically reconfigurable bit elements P1, P9, and P11, first, light is emitted only to the optically reconfigurable bit elements P1, P9, and P11 with the first optical signal pattern. Thus, an inverse output terminal ¬Q (symbol "¬" denotes the negative logic) of the D flip-flop 22 is output to the output of the tri-state buffer 24 of the optically reconfigurable bit element P1. Since the D flip-flop 22 is cleared, the H level is outputted to the inverse output terminal ¬Q of the D flip-flop 22. Therefore, the output of the tri-state buffer 24 of the optically reconfigurable bit element P1 is at the H level.

Subsequently, with a second optical signal pattern, light is emitted only to the optically reconfigurable bit elements P1, P9, P11, and P13.

In the state in which the optical signal is not input to the optically reconfigurable bit elements P29 to P40, all the multiplexers 20 output the L level and the multiplexer 21a selects the output of the optically reconfigurable bit element P13. Therefore, when light is emitted to the optically reconfigurable bit element P13, the output of the multiplexer 21a changes from the L level to the H level.

Thereafter, the clock of the D flip-flop 22 rises. Thus, the output of the inverse output terminal ¬Q of the D flip-flop 22 changes from the H level to the L level. Further, the output of the tri-state buffer 24 of the optically reconfigurable bit element P1 changes from the H level to the L level.

Therefore, the output of the tri-state buffer 24 of the optically reconfigurable bit element P1 is pulled-out to the input/output terminal 34 via the ORSM 13 and the ORIOB 14 and the change in output state is detected by the output state detection circuit 7, thereby inspecting the write state of the optically reconfigurable bit element P13.

EXAMPLE END

INDUSTRIAL APPLICABILITY

The present invention is advantageous to various electronics industries as a programmable logical circuit and an inspection method thereof that can optically rewrite the logical structure.

The invention claimed is:

1. A write state inspection method of an optically reconfigurable gate array, the optically reconfigurable gate array including a logical circuit chip having a logical circuit having a plurality of optically reconfigurable bit elements and enabling the reconfiguration of the logical structure of the logical circuit by reading a desired optical signal pattern stored in an optical memory and irradiating a logical circuit chip with an optical signal, the write state inspection method for inspecting an information write state of the optically reconfigurable bit element with the optical signal, comprising:

a first step of configuring, to the logical circuit, a logical structure (hereinafter, a "logical circuit for inspection") for inspecting the optically reconfigurable bit element by irradiating an optical signal pattern for inspection (hereinafter, referred to as an "inspection pattern") stored in advance to the optical memory to the logical circuit chip;

a second step of detecting whether an output state of an output terminal of the logical circuit chip to the logical circuit for inspection is a state of the logical level as the H level, the logical level as the L level, or the output impedance as high impedance; and a third step of judging, by comparing the detected state with the normal output state of the logical circuit for inspection, whether the information write state of the optically reconfigurable bit element with the optical signal is successful or unsuccessful, wherein the inspection pattern includes a first inspection pattern in which the optical signal irradiated to the optically reconfigurable bit element as an inspection target is in an OFF-state and a second inspection pattern in which the optical signal irradiated to the optically reconfigurable bit element as the inspection target is in an ON-state, and the first step to third step are executed by sequentially irradiating the first and second inspection patterns in order of the two inspection patterns or inverse order.

2. The write state inspection method according to claim 1, wherein the logical circuit for inspection has a logical structure in which the output of the output terminal of the logical circuit chip changes depending on an input of the optical signal to the optically reconfigurable bit element as the inspection target.

3. The write state inspection method according to claim 1, wherein the logical circuit for inspection has a logical structure in which the output of the output terminal of the logical circuit chip changes depending on the input of the optical signal to the optically reconfigurable bit element and does not depend on the input of the optical signal to the optically reconfigurable bit element whose inspection of the write state does not end yet.

4. A write state inspection device of an optically reconfigurable gate array, the optically reconfigurable gate array including a logical circuit chip having a logical circuit having a plurality of optically reconfigurable bit elements and enabling the reconfiguration of the logical structure of the logical circuit by reading a desired optical signal pattern stored in an optical memory and irradiating a logical circuit chip with an optical signal, the write state inspection device for inspecting an information write state of the optically reconfigurable bit element with the optical signal comprising:

the optical memory that stores an optical signal pattern for inspection (hereinafter, "inspection pattern") for configuring a logical structure (hereinafter, "logical circuit for inspection") for inspecting the optically reconfigurable bit element to the logical circuit;

inspection-signal input means that reads the inspection pattern stored in the optical memory as an optical signal pattern and irradiates the logical circuit chip; and output-state detection means that detects whether the output state of an output terminal of the logical circuit chip is the logical level as the H level, logical level as the L level, or output impedance as high impedance, wherein the optical memory stores a first inspection pattern in which the optical signal irradiated to the optically reconfigurable bit element as an inspection target is in the OFF-state and a second inspection pattern in which the optical signal irradiated to the optically reconfigurable bit element as the inspection target is in the ON-state, the inspection-signal input means sequentially irradiates the first and second inspection patterns in order of the two inspection patterns or inverse order, and the output-state detection means detects, for the inspection patterns, whether the output state of the output terminal of the logical circuit chip is the logical level as the H level, logical level as the level, or output impedance as high impedance.

5. The write state inspection device according to claim 4, further comprising:

output-state judgment means that judges, by comparing the output state of the output terminal of the logical circuit chip of the logical circuit for inspection detected by the output state detection circuit with a normal output state of the logical circuit for inspection, whether the information write state of the optically reconfigurable bit element with the optical signal is successful or unsuccessful.

6. The write state inspection device according to claim 4, wherein the logical circuit for inspection has a logical structure in which the output of the output terminal of the logical circuit chip changes depending on the input of the optical signal to the optically reconfigurable bit element as an inspection target.

7. The write state inspection device according to claim 4, wherein the output-state detection means comprises:

a voltage detection circuit that detects a voltage of the output terminal of the logical circuit; and a detection voltage applying circuit that switchably applies a voltage not less than a logical threshold or voltage not more than the logical threshold to the output terminal of the logical circuit via a resistor.

8. An optically reconfigurable gate array including a logical circuit chip having a logical circuit having a plurality of optically reconfigurable bit elements and enabling the reconfiguration of a logical structure of the logical circuit by reading a desired optical signal pattern stored in an optical memory and irradiating the logical circuit chip with an optical signal, the optically reconfigurable gate array comprising:

an output-state detection circuit that is connected to an output terminal of the logical circuit chip and detects the logical level of the output terminal as the H level state, the logical level of the output terminal as the L level state, or the output impedance of the output terminal as the high impedance state, wherein the logical circuit mounted on the logical circuit chip comprises:

an optically reconfigurable logical block having an optically reconfigurable logical circuit having a plurality of optically reconfigurable bit elements for reconfiguring the logical structure;

an optically reconfigurable connecting circuit serving as a connecting circuit for switching wiring connection of a logical signal input/output to the optically reconfigurable logical block, having a plurality of the optically reconfigurable bit elements that reconfigure the connecting structure thereof; and an optically reconfigurable input/output circuit, serving as an input/output circuit for switching the connection between an input/output terminal and the wiring, having a plurality of the optically reconfigurable bit elements for reconfiguring the connecting structure thereof, and the optically reconfiguring input/output circuit is arranged at least three vertexes of a quadrangular logical circuit chip on which the logical circuit is mounted.

9. The optically reconfigurable gate array according to claim 8, wherein the output state detection circuit comprises:

a voltage detection circuit that detects a voltage of the output terminal of a logical signal of the logical circuit; and a detection voltage applying circuit that applies a voltage not less than a logical threshold or voltage not more than the logical value to the output terminal of the logical signal of the logical circuit via a resistor.

10. The write state inspection device according to claim 5, wherein the logical circuit for inspection has a logical structure in which the output of the output terminal of the logical circuit chip changes depending on the input of the optical signal to the optically reconfigurable bit element as an inspection target.

11. The write state inspection device according to claim 5, wherein the output-state detection means comprises:

a voltage detection circuit that detects a voltage of the output terminal of the logical circuit; and a detection voltage applying circuit that switchably applies a voltage not less than a logical threshold or voltage not more than the logical threshold to the output terminal of the logical circuit via a resistor.

12. The write state inspection device according to claim 6, wherein the output-state detection means comprises:

a voltage detection circuit that detects a voltage of the output terminal of the logical circuit; and a detection voltage applying circuit that switchably applies a voltage not less than a logical threshold or voltage not more than the logical threshold to the output terminal of the logical circuit via a resistor.

13. The write state inspection device according to claim 10, wherein the output-state detection means comprises:

a voltage detection circuit that detects a voltage of the output terminal of the logical circuit; and a detection voltage applying circuit that switchably applies a voltage not less than a logical threshold or voltage not more than the logical threshold to the output terminal of the logical circuit via a resistor.

* * * * *